(12) United States Patent
Rothschild

(10) Patent No.: US 9,172,034 B2
(45) Date of Patent: Oct. 27, 2015

(54) MEMORY DIODES

(75) Inventor: Avner Rothschild, Haifa (IL)

(73) Assignee: TECHNION RESEARCH & DEVELOPMENT FOUNDATION, Haifa (IL)

( * ) Notice: Subject to any disclaimer, the term of this patent is extended or adjusted under 35 U.S.C. 154(b) by 67 days.

(21) Appl. No.: 13/818,100

(22) PCT Filed: Sep. 18, 2011

(86) PCT No.: PCT/IB2011/054076
§ 371 (c)(1),
(2), (4) Date: Feb. 21, 2013

(87) PCT Pub. No.: WO2012/038874
PCT Pub. Date: Mar. 29, 2012

(65) Prior Publication Data
US 2013/0234098 A1 Sep. 12, 2013

Related U.S. Application Data

(60) Provisional application No. 61/384,589, filed on Sep. 20, 2010.

(51) Int. Cl.
*H01L 45/00* (2006.01)
*G11C 11/36* (2006.01)
*G11C 13/00* (2006.01)

(52) U.S. Cl.
CPC .............. *H01L 45/085* (2013.01); *G11C 11/36* (2013.01); *G11C 13/00* (2013.01); *G11C 13/0002* (2013.01); *G11C 13/0004* (2013.01); *H01L 45/1253* (2013.01); *G11C 13/0007* (2013.01)

(58) Field of Classification Search
USPC ............ 257/43, 536, E29.002, 2, 4, 310, 594, 257/910, 184, 316, 295, 296; 438/3, 385; 365/175, 184, 243, 105, 185.24
See application file for complete search history.

(56) References Cited

U.S. PATENT DOCUMENTS 6,921,912 B2 * 7/2005 Campbell .................... 257/4
7,450,416 B1 11/2008 Kaza et al.
(Continued)

FOREIGN PATENT DOCUMENTS

WO 2010085227 A1 7/2010

OTHER PUBLICATIONS

International Application PCT/IB2011/054076 Search Report dated Jul. 3, 2012.
(Continued)

*Primary Examiner* — Matthew Reames
*Assistant Examiner* — Vincent Wall
(74) *Attorney, Agent, or Firm* — D. Kligler I.P. Services Ltd.

(57) ABSTRACT

A memory cell (32C), including a first non-insulator (34C) and a second non-insulator (40C), different from the first non-insulator. The second non-insulator forms a junction (46C) with the first non-insulator. The cell further includes a first electrode (48C) which is connected to the first non-insulator and a second electrode (50C) which is connected to the second non-insulator. At least one of the first and second non-insulators is chosen from a group consisting of a solid electrolyte and a mixed ionic electronic conductor and has an ionic transference number less than 1 and greater than or equal to 0.5.

26 Claims, 11 Drawing Sheets

(56) References Cited

U.S. PATENT DOCUMENTS

2009/0039336 A1* 2/2009 Terao et al. .................. 257/4
2009/0218565 A1   9/2009 Kawano et al.
2010/0157658 A1* 6/2010 Schloss et al. ............ 365/148
2010/0157710 A1* 6/2010 Lambertson et al. ...... 365/218

OTHER PUBLICATIONS

Karg et al., "Transition-metal-oxide-based resistance-change memories", IBM Journal of Research and Development, vol. 52, No. 4/5, pp. 481-492, Jul./Sep. 2008.

Yang et al.,"Memristive switching mechanism for metal/oxide/metal nanodevices", Nature Nanotechnology, vol. 3, pp. 429-433, Jul. 2008.

Waser et al.,"Redox-Based Resistive Switching Memories—Nanoionic Mechanisms, Prospects, and Challenges", Advanced Materials, vol. 21, issue 25-26, pp. 2632-2663, Jul. 13, 2009.

Strukov et al.,"The missing memristor found", Nature, vol. 453, pp. 80-83, May 1, 2008.

Yang et al.,"A Family of Electronically Reconfigurable Nanodevices", Advanced Materials, vol. 21, issue 27, pp. 3754-3758, Oct. 5, 2009.

Borghetti et al.,"'Memristive' switches enable 'stateful' logic operations via material implication", Nature, vol. 464, pp. 873-876, Apr. 8, 2010.

Linn et al., "Complementary resistive switches for passive nanocrossbar memories", Nature Materials, vol. 9, pp. 403-406, May 2010.

Chua et al.,"Memristor—The Missing Circuit Element", IEEE Transactions on Circuit Theory, vol. 18, No. 5, pp. 507-519, Sep. 1971.

Chua et al.,"Memristive Devices and systems", Proceedings of the IEEE, vol. 64, issue 2, pp. 209-223, Feb. 1976.

Jamnik at al.,"Generalised equivalent circuits for mass and charge transport :chemical capacitance and its implications", Physical Chemistry Chemical Physics, vol. 3, pp. 1668-1678, year 2001.

Maier, J., "Conductivity in an activity gradient", Journal of Physics and Chemistry of Solids, vol. 46, issue 2, pp. 197-200, year 1985.

Jamnik, J.,"Electrochemistry of Crystalline Mixed Conductors: Concepts and Examples with SrTiO3", Chemical and Biochemical Engineering Quarterly 21, pp. 15-19, year 2007.

Vanhandel et al., "The Temperature and Oxygen Pressure, Dependence of the Ionic Transference Number of Nonstoichiometric CeO2—x", Journal of the Electrochemical Society, vol. 121, No. 9, pp. 1198-1202 , Sep. 1974.

* cited by examiner

FIG. 6
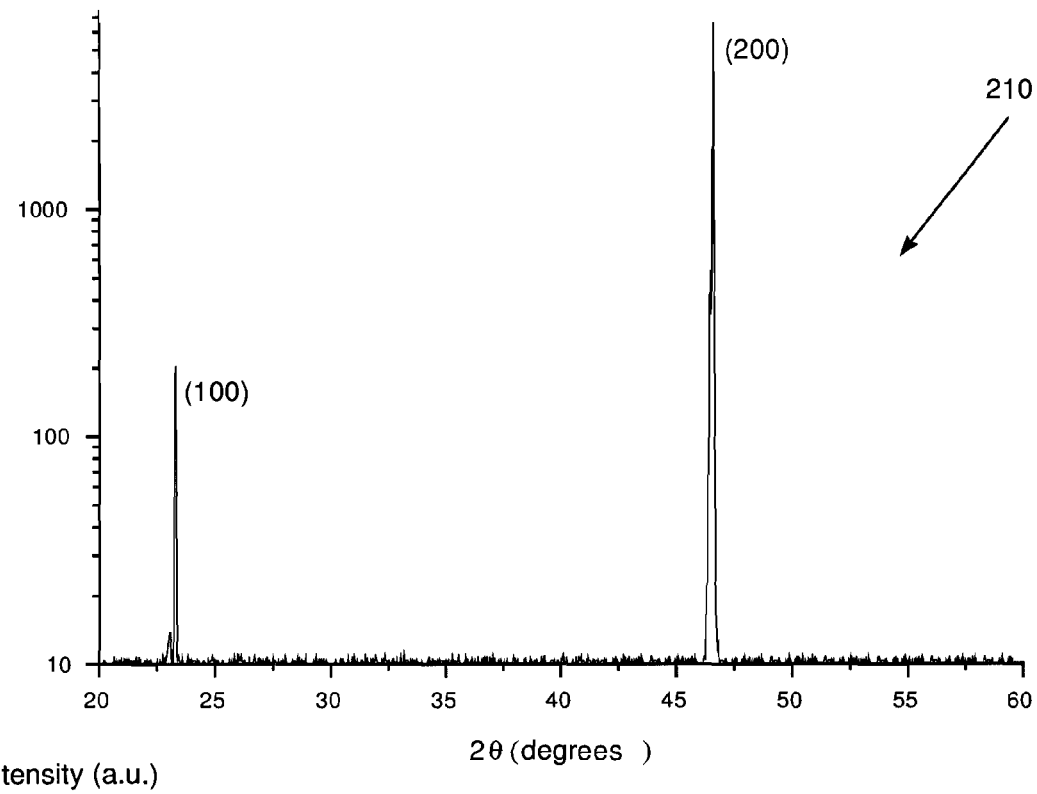
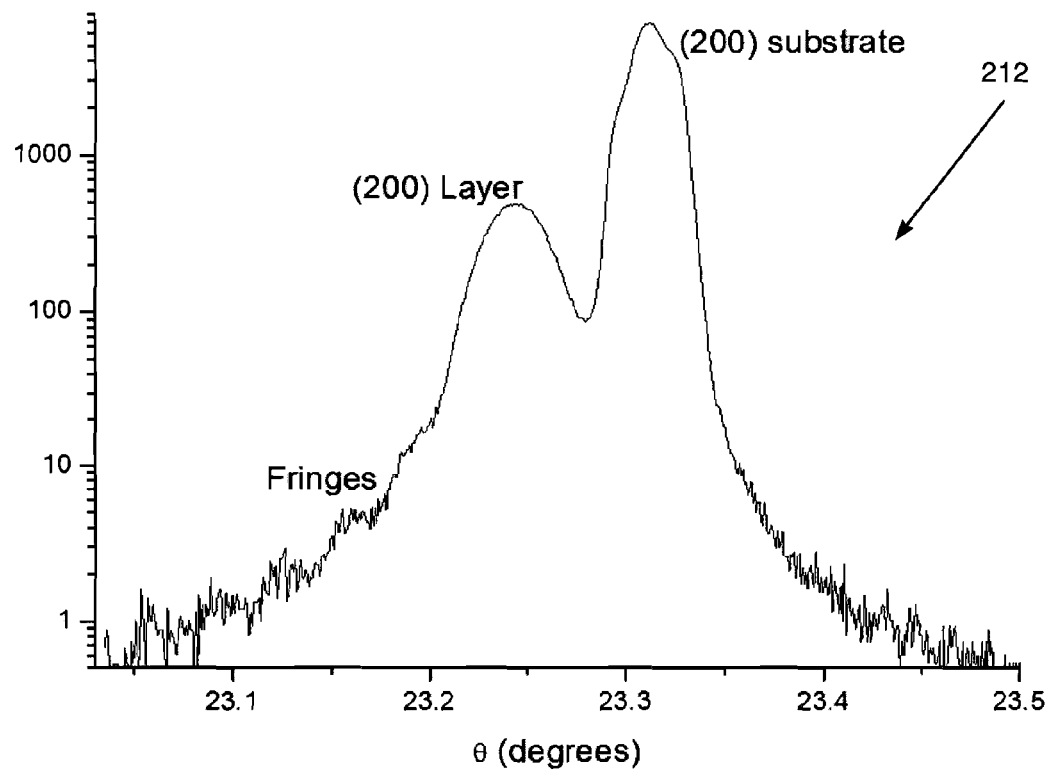

MEMORY DIODES

CROSS-REFERENCE TO RELATED APPLICATION

This application claims the benefit of U.S. Provisional Patent Application 61/384,589, filed 20 Sep. 2010, which is incorporated herein by reference

FIELD OF THE INVENTION

The present invention relates generally to memory devices, and particularly to memory devices formed from non-insulating materials.

BACKGROUND OF THE INVENTION

A number of different memory systems are known in the art. However, known technological and scaling limitations of the memories based on existing technologies, such as flash memories, generate problems for the microelectronics industry. The problems are compounded for the memory industries.

Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

SUMMARY OF THE INVENTION

An embodiment of the present invention provides a memory cell, including:

a first non-insulator;

a second non-insulator, different from the first non-insulator, forming a junction with the first non-insulator;

a first electrode connected to the first non-insulator; and a second electrode connected to the second non-insulator, wherein at least one of the first and second non-insulators is chosen from a group consisting of a solid electrolyte and a mixed ionic electronic conductor and has an ionic transference number less than 1 and greater than or equal to 0.5.

Typically, the first non-insulator and the second non-insulator are selected so that the junction acts as a diode.

Typically, at least one of the first and the second non-insulators is selected from a group including a p-type material having a preponderance of holes, an n-type material having a preponderance of electrons, and an i-type, intrinsic material. One of the first and the second non-insulators may include a metal.

Typically, the cell is configurable into one of two different stable states. The cell may be configured into one of the two different states in response to applying one of a forward and a reverse current to the cell. The cell may have a hysteresis, so that the states include a low-current high-resistance state and a high-current low-resistance state. The hysteresis may be configured by applying one of a preset voltage and a voltage changing at a preset rate to the cell. The one of the two different stable states may be ascertained by measuring a current generated on application of a read voltage between the first and second electrodes.

Alternatively or additionally, the two stable states may have differing open circuit voltages between the first and the second electrodes. In one embodiment one of the two stable states has a zero open circuit voltage. Typically, the one of the two stable states is determined by measuring a potential between the first and the second electrodes.

In a disclosed embodiment the cell is configurable to store energy.

There is further provided, according to an embodiment of the present invention, a memory cell, including:

a first non-insulator;

a second non-insulator;

a first electrode connected to the first non-insulator;

a second electrode connected to the second non-insulator; and n third non-insulators, where n is an integer greater than or equal to 1, connected sequentially between the first and second non-insulators to form (n+1) junctions, wherein at least one of the first, second and n third non-insulators is chosen from a group consisting of a solid electrolyte and a mixed ionic electronic conductor and has an ionic transference number less than 1 and greater than or equal to 0.5, so that the cell is configurable into one of $2^{(n+1)}$ stable states, and wherein at least two of the stable states are different.

Typically, the (n+1) junctions form {n+1} diodes.

In a disclosed embodiment the cell has a hysteresis, and the $2^{(n+1)}$ stable states are defined by respective hysteresis states of the cell.

In a further disclosed embodiment the $2^{(n+1)}$ stable states have respective $2^{(n+1)}$ open circuit voltages. A first open circuit voltage of the $2^{(n+1)}$ open circuit voltages may be zero, and a second open circuit voltage may be different from zero.

In a yet further disclosed embodiment, the $2^{(n+1)}$ stable states include up to $2^{(n+1)}$ different stable states.

There is further provided, according to an embodiment of the present invention, a memory array, including:

a first non-insulator layer;

a second non-insulator layer, different from the first non-insulator layer, forming a junction layer with the first non-insulator layer;

a first electrode layer connected to the first non-insulator layer; and a second electrode layer connected to the second non-insulator and configured to define a plurality of memory cells within the array, wherein at least one of the first and second non-insulator layers is chosen from a group consisting of a solid electrolyte and a mixed ionic electronic conductor and has an ionic transference number less than 1 and greater than or equal to 0.5.

Typically, the second electrode layer includes a multiplicity of isolated electrodes corresponding to the plurality of memory cells.

In an alternative embodiment the first electrode layer is configured as a first multiplicity of parallel conductors, and the second electrode layer is configured as a second multiplicity of parallel conductors not parallel to the first multiplicity. Typically, each of the plurality of memory cells is defined by a respective different intersection between the first and the second multiplicities.

There is further provided, according to an embodiment of the present invention, apparatus, including:

a first non-insulator; and a second non-insulator, different from the first non-insulator, forming a junction with the first non-insulator, at least one of the first and second non-insulators being chosen from a group consisting of a solid electrolyte and a mixed ionic electronic conductor and having an ionic transference number less than 1 and greater than or equal to 0.5.

Typically, the first non-insulator and the second non-insulator are selected so that the junction acts as a diode. In a disclosed embodiment the diode has a hysteresis.

In an alternative embodiment at least one of the first and the second non-insulators is selected from a group including a p-type material having a preponderance of holes, an n-type material having a preponderance of electrons, and an i-type, intrinsic material. In a further alternative embodiment one of the first and the second non-insulators includes a metal. Typically, the first and the second non-insulators are configurable to store energy.

There is further provided, according to an embodiment of the present invention, a method for forming a memory cell, including:

providing a first non-insulator;

forming with a second non-insulator, different from the first non-insulator, a junction with the first non-insulator;

connecting a first electrode to the first non-insulator; and connecting a second electrode to the second non-insulator, wherein at least one of the first and second non-insulators is chosen from a group consisting of a solid electrolyte and a mixed ionic electronic conductor and has an ionic transference number less than 1 and greater than or equal to 0.5.

There is further provided, according to an embodiment of the present invention, a method for forming a memory cell, including:

providing a first non-insulator;

providing a second non-insulator;

connecting a first electrode to the first non-insulator;

connecting a second electrode to the second non-insulator; and connecting n third non-insulators, where n is an integer greater than or equal to 1, sequentially between the first and second non-insulators to form (n+1) junctions, wherein at least one of the first, second and n third non-insulators is chosen from a group consisting of a solid electrolyte and a mixed ionic electronic conductor and has an ionic transference number less than 1 and greater than or equal to 0.5, so that the cell is configurable into one of $2^{(n+1)}$ stable states, and wherein at least two of the stable states are different.

There is further provided, according to an embodiment of the present invention, a method for forming a memory array, including:

providing a first non-insulator layer;

connecting a second non-insulator layer, different from the first non-insulator layer, to form a junction layer with the first non-insulator layer;

connecting a first electrode layer to the first non-insulator layer; and connecting a second electrode layer to the second non-insulator, wherein the second electrode layer is configured to define a plurality of memory cells within the array, wherein at least one of the first and second non-insulator layers is chosen from a group consisting of a solid electrolyte and a mixed ionic electronic conductor and has an ionic transference number less than 1 and greater than or equal to 0.5.

There is further provided, according to an embodiment of the present invention, a method, including:

providing a first non-insulator; and connecting a second non-insulator, different from the first non-insulator, to form a junction with the first non-insulator, at least one of the first and second non-insulators being chosen from a group consisting of a solid electrolyte and a mixed ionic electronic conductor and having an ionic transference number less than 1 and greater than or equal to 0.5.

The present disclosure will be more fully understood from the following detailed description of the embodiments thereof, taken together with the drawings, in which:

BRIEF DESCRIPTION OF THE DRAWINGS

FIG. 6 shows schematic X-ray diffraction diffractograms of non-insulator layers of single cells, according to an embodiment of the present invention;

DETAILED DESCRIPTION OF EMBODIMENTS

Overview

An embodiment of the present invention provides a memory cell, which is typically configured within an array of substantially similar memory cells. Each cell in the array has at least one junction, each junction being formed between two non-insulator materials. The two non-insulators are typically configured as layers of the array. At least one of the first and second non-insulators is chosen from a group consisting of a solid electrolyte and a mixed ionic electronic conductor and has an ionic transference number which is less than 1 and greater than or equal to 0.5. Typically, the non-insulator materials are selected so that the junction formed by the materials acts as a diode, having rectifying properties.

The inventor has found that a cell formed as described above has a hysteresis characteristic, and the hysteresis enables the cell to exist in different numbers of stable states.

Thus, a cell having one junction can exist in two different stable states. Which state a cell is in may be determined by applying a read voltage to the cell, and measuring which of different possible currents the cell delivers.

The inventor has also found that in addition to the hysteresis characteristic exhibited by a cell, the cell is also able to store energy in at least one of its states, and the stored energy is manifested as a non-zero open circuit voltage. Thus, a single junction cell may exist in a first state having zero open circuit voltage, and a second state having a non-zero open circuit voltage, so that the state of a cell may be measured by determining the open circuit voltage.

When formed in arrays, memory cells of the present invention have considerably smaller cross-talk to adjacent cells than cells based on other junctions, such those of metal-insulator-metal devices.

System Description

Embodiments of the present invention provide cells which are typically formed as arrays comprising more than one such cell. For clarity, except where otherwise stated, the following description assumes such arrays, and those having ordinary skill in the art will be able to adapt the description, *mutatis mutandis*, for the case of a single cell.

Figure 1:
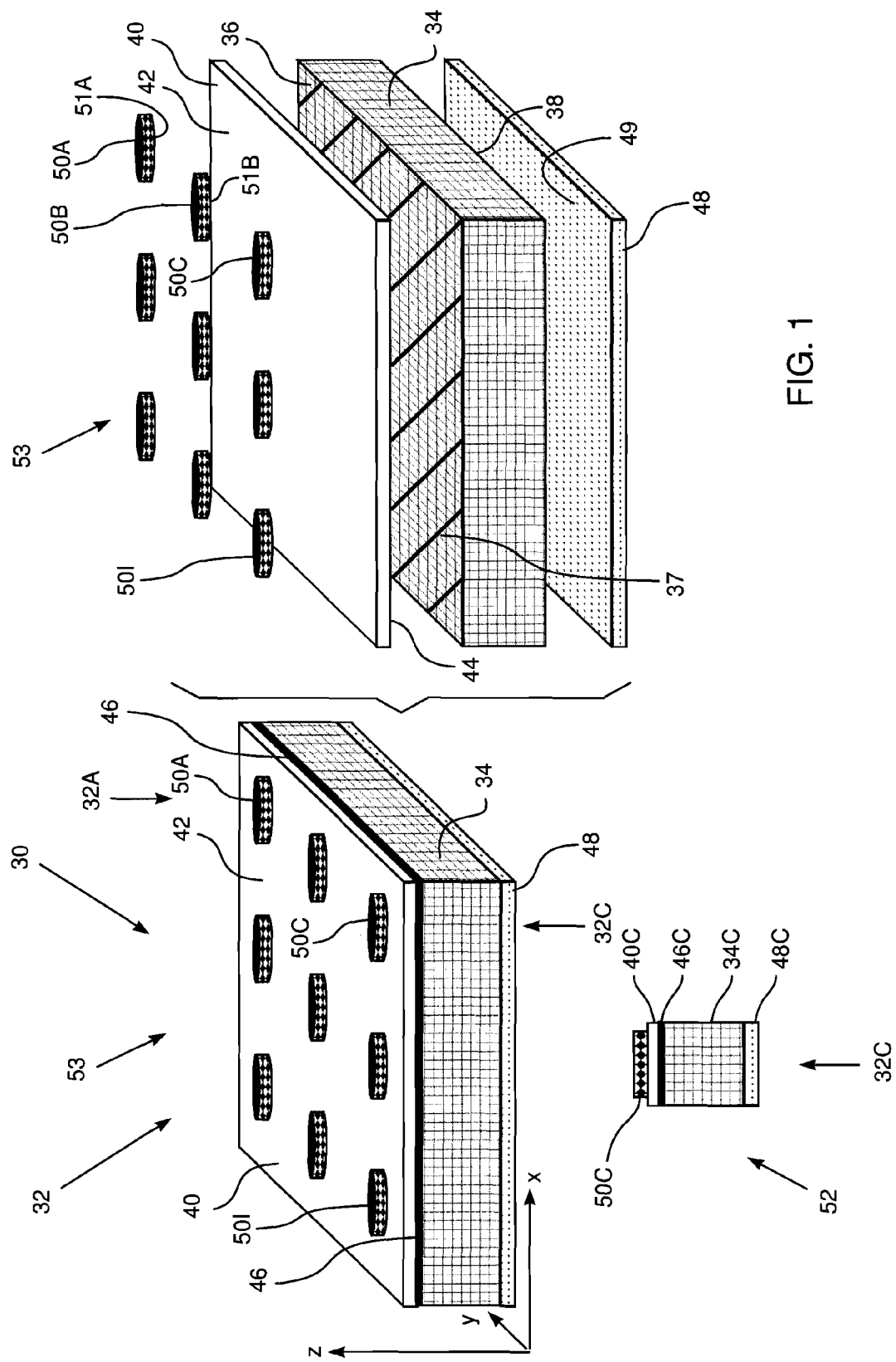
FIG. 1 is a schematic illustration of an array of memory diode cells, according to an embodiment of the present invention.

Reference is now made to FIG. 1, which is a schematic illustration of an array 30 of cells, according to an embodiment of the present invention. As is explained in more detail below, each cell of array 30 acts, inter alia, as a memory diode, and may also be referred to herein as a memory diode cell. A memory diode cell is assumed to function as a diode that has electrical rectifying characteristics and that is also able to act as a memory device, storing information. Typically the information stored comprises binary information, wherein a given memory diode cell may be in one of two possible stable states. In some embodiments the information may be "multi-nary," wherein the cell may be in one of more than two states. The state of a memory diode cell may be read and/or changed by an entity, such as a potential sensor, a current sensor, or a charge sensor, external to the memory diode cell. In addition to storing information, a memory diode cell is also able to store energy, and supply the stored energy to an external device.

In the following description, array 30 is assumed to have a generally box-like shape, with edges defining an orthogonal set of xyz axes, wherein the z axis is a vertical axis. However, it will be understood that the assumption of the shape and orientation of array 30 is purely by way of example and for clarity, so that in practice array 30 may have substantially any suitable shape and substantially any orientation. It will also be understood that designations herein such as "upper," "lower," "above," or "below" in describing the relations between elements of array 30 are for simplicity and clarity, and are not limiting.

In array 30 a substrate layer 34, assumed to be a generally rectangular sheet and to be lying generally parallel to an xy plane, is used as a mount for the array of cells. In array 30, the properties, described below, of substrate layer 34 are selected so that the substrate layer also acts as a functional component of the array. (Embodiments wherein the substrate layer does not act as a functional component of a memory diode cell array are described below.) Substrate layer 34 has an upper surface 36 and a lower surface 38, and comprises a first solid material which is a non-insulator. Substrate layer 34 may herein also be referred to as first non-insulator layer 34.

A second non-insulator layer 40, having different properties to those of the first non-insulator layer, is a generally rectangular sheet. Layer 40, by way of example, may have generally the same xy dimensions as the first non-insulator layer, and also lies generally parallel to the xy plane. Second non-insulator layer 40 is a solid having properties causing it to also act as a functional component of the array. The second non-insulator layer has an upper surface 42 and a lower surface 44, and it is mounted so that its lower surface 44 is in contact with upper surface 36 of the first non-insulator layer. A region of contact 37 of the two non-insulator layers, shown for surface 36 by hatching, thus forms a junction layer 46.

A conducting layer, typically an inert metal such as platinum or gold, is connected to lower surface 38 of first non-insulator layer 34, and acts as a first electrode layer 48 for the array. In array 30, first electrode layer 48 may comprise a conducting sheet of material having, by way of example, generally the same xy dimensions as the non-insulator layers.

A plurality of discrete, isolated, electrodes 50A, 50B, . . . , herein by way of example assumed to comprise generally similar discs, are connected to upper surface 42 of second non-insulator layer 40. Electrodes 50A, 50B, . . . are herein generically also referred to as electrodes 50, and are assumed to form a second electrode layer 53. Each electrode 50 in layer 53 forms a section of the layer and is typically formed from inert metal, such as that used for layer 48. Electrodes 50 are typically arranged in a two-dimensional repeating pattern that may be defined vectorially, as is known in the art. In array 30 there may be any convenient number of electrodes 50 in layer 53, and the electrodes are typically arranged symmetrically on a rectangular xy grid. By way of example, FIG. 1 illustrates nine electrodes 50A, 50B, . . . 50I of layer 53.

Typically, although not necessarily, first electrode layer 48 comprises a metallic bonding layer 49 which bonds the first electrode layer to lower surface 38 of the first non-insulator. A metallic bonding layer may be formed from a non-inert metal, such as Ti, Al, or Cr. In addition, electrodes 50A, 50B, . . . may also comprise respective metallic bonding layers 51A, 51B, . . . which bond the respective electrodes to upper surface 42 of the second non-insulator.

As stated above, electrodes 50A, 50B, . . . 50I are isolated from each other, and each electrode defines a respective memory diode cell 32A, . . . 32C . . . , generically referred to herein as cells 32, in array 30. For clarity, in the following description, at least some of the components of a given cell 32 formed by layers of array 30 may be differentiated from each other by appending a corresponding letter to the identifying numeral of the layer, or layer sections, of the array, where the components comprise all or part of second electrode layer 53, first non-insulator layer 34, second non-insulator layer 40, and first electrode layer 48.

Thus, as illustrated by a diagram 52, the components of cell 32C, defined by electrode 50C, comprise the electrode, a non-insulator section 40C of second non-insulator layer 40, a non-insulator section 34C of first non-insulator layer 34, a junction section 46C of junction layer 46, and an electrode section 48C of first electrode layer 48, the sections lying generally beneath electrode 50C. Electrode 50C may also comprise bonding layer section 51C, and section 48C may also comprise a section of bonding layer 49.

Typically, although not necessarily, at least some of sections 40C, 34C, 46C, and 48C have generally the same shape as electrode 50C, but may differ in size. For example, since first electrode layer 48 is a conducting sheet, section 48C may be substantially larger than electrode 50C, depending on the resistivity of the sheet. All cells 32 in array 30 have substantially the same structures, and it will be understood that the isolation of individual electrodes 50 from each other allows cells 32 to be individually addressed, typically by individual conductors (not shown in the figure) attached to the electrodes.

Properties of the different layers of array 30 are described below.

Figure 2:
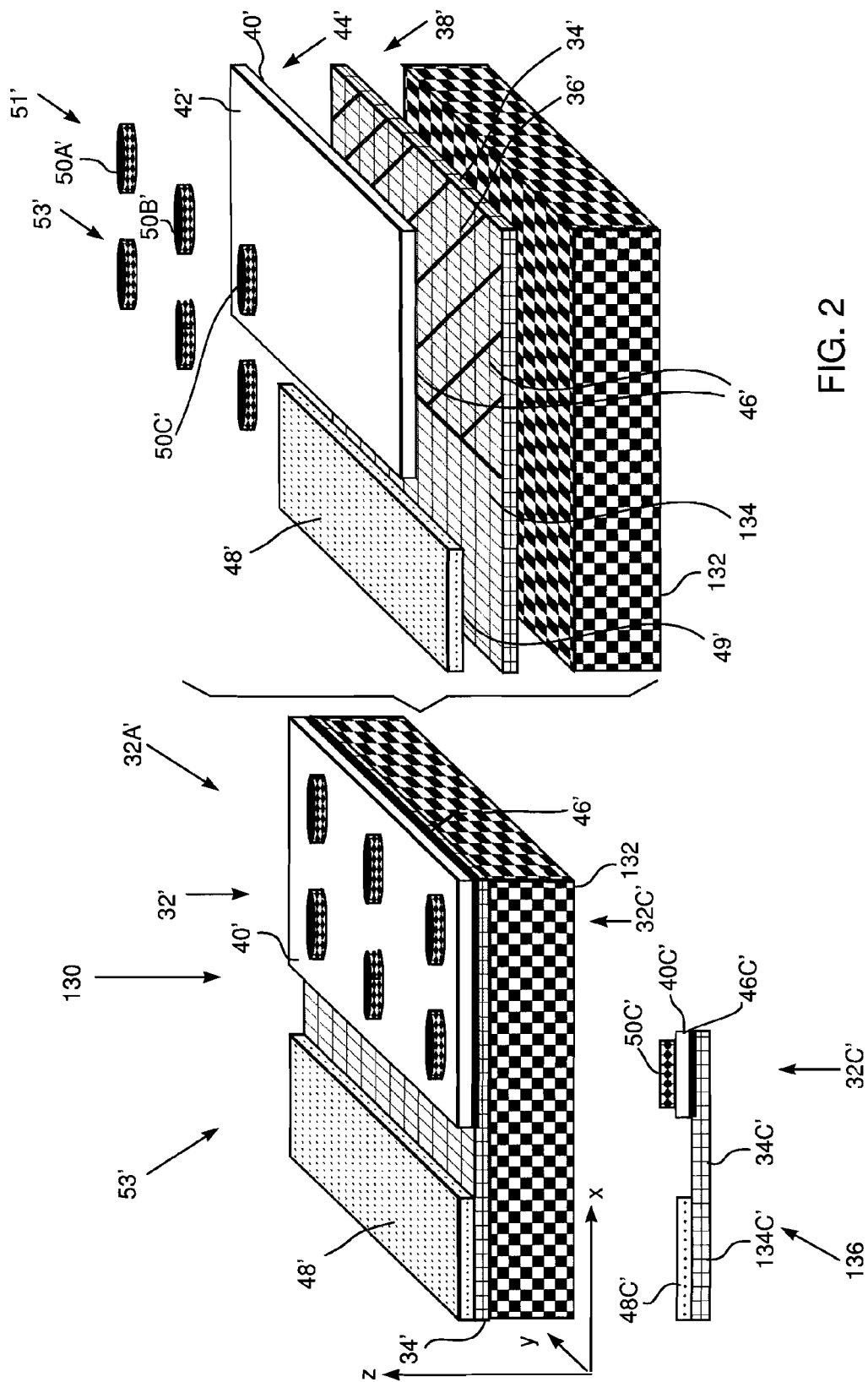
FIG. 2 is a schematic illustration of an array of memory diode cells, according to an alternative embodiment of the present invention.

FIG. 2 is a schematic illustration of an array 130 of memory diode cells, according to an alternative embodiment of the present invention. Apart from the differences described below, the operation of array 130 is generally similar to that of array 30 (FIG. 1), and elements indicated by the same reference numerals in both arrays 30 and 130 are generally similar in construction and in operation. For clarity, elements that are similar in the two arrays are differentiated by appending an apostrophe to the reference numerals in elements in array 130. Thus, array 130 comprises a second electrode layer 53', a first non-insulator layer 34', a second non-insulator layer 40', a junction layer 46', and a first electrode layer 48'.

In contrast to array 30, in array 130 first non-insulator layer 34' does not act as a substrate for the array. Thus, while by way of example in array 130 first non-insulator layer 34' is assumed to have similar x and y dimensions to layer 34 in array 30, it typically may have a smaller z dimension than the z dimension of first insulator layer 34 of array 30. To support its elements, array 130 comprises a separate, insulating substrate layer 132. First non-insulator layer 34' is mounted on substrate layer 132, so that lower surface 38' of the first insulator layer contacts the substrate.

Second non-insulator layer 40' is assumed by way of example to have similar y and z dimensions to layer 40 of array 30, but to have a smaller x dimension. Lower surface 44' of layer 40' contacts upper surface 36' of layer 34' to form junction 46'. Because of the smaller x dimension of layer 40', there is a region 134 on upper surface 36' that does not form junction 46', and first electrode layer 48' is dimensioned to suit this region. In contrast to array 30, in array 130 first electrode layer 48' is mounted on upper surface 36' in region 134.

In array 130 second electrode layer 53' has, by way of example, six disc electrodes 50A', 50B', ... 50F' (referred to herein together as electrodes 50'), mounted to contact surface 42'. As for array 30, electrodes 50' in array 130 may comprise a bonding layer 51' to bond the electrodes to mating surface 42', and electrode layer 48' may comprise a bonding layer 49' for bonding the layer to surface 36' of non-insulator layer 34'. As for array 30, in array 130 each disc electrode 50' defines a separate memory diode cell 32', so that in the example embodiment illustrated by FIG. 2, there are six memory diode cells.

A diagram 136 illustrates the structure of one of memory cells 32', 32C', in more detail. Cell 32C' comprises a non-insulator section 40C' of second non-insulator layer 40', a non-insulator section 34C' of first non-insulator layer 34', a junction section 46C' of junction layer 46', and an electrode section 48C' of electrode layer 48'. However, in contrast to the cells of array 30, cells 32' use a portion 134C' of region 134 to form a conducting path to electrode layer 48'.

In the description herein, arrays such as array 130 comprise two non-insulator layers which are typically thin. These arrays are also referred to as dual film arrays, and the cells of dual film arrays are referred to as dual film cells. In contrast, arrays such as array 30 comprise two non-insulator layers, one of which is thin, the other being thick. These arrays are also referred to herein as single film arrays, and their cells as single film cells.

It will be understood that there are configurations of arrays of memory diode cells other than those described above with reference to FIGS. 1 and 2. For example, rather than first electrode layer 48 of array 30 being in the general form of a single continuous sheet, the electrode layer may be in the form of two or more separate sheets, and/or may have apertures. Examples of other configurations of arrays of memory diode cells are described below.

Figure 3:
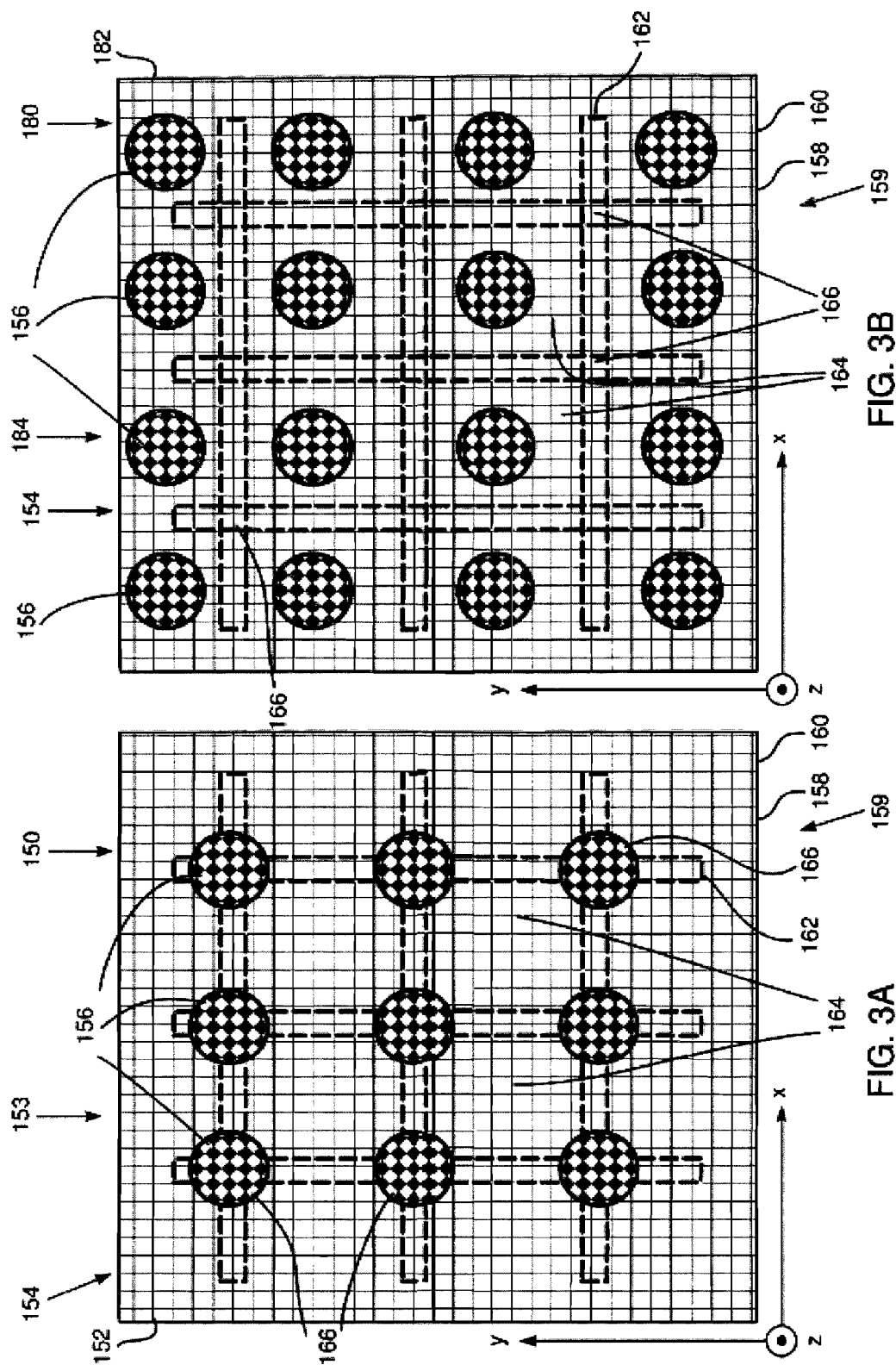
FIGS. 3A and 3B are schematic diagrams illustrating alternative configurations of arrays of memory diode cells, according to an embodiment of the present invention.

FIGS. 3A and 3B are schematic diagrams illustrating alternative configurations of arrays of memory diode cells, according to an embodiment of the present invention. A diagram 150 illustrates a top view of an array 152, which functions generally as array 30, and except for the differences described below is assumed to be configured generally as array 30 (FIG. 1). Thus array 152 comprises memory diode cells 153, formed from a second electrode layer 154 having separate electrode discs 156, a first non-insulator layer 158 acting as a substrate, a second non-insulator layer 160, and a first electrode layer 162, the layers being stacked parallel to the z axis, as in array 30. Layers 158 and 160 form a junction layer 159. Second electrode layer 154, discs 156, first non-insulator layer 158, junction layer 159, and second non-insulator layer 160 are respectively substantially similar to second electrode layer 53, discs 50, first non-insulator layer 34, junction layer 46, and second non-insulator layer 40.

However, unlike first electrode layer 48, which is a continuous sheet, first electrode layer 162 is in the form of a mesh in an xy plane, having apertures 164 therein. The mesh is sized to correspond with the positions of electrode discs in second electrode layer 154, so that junctions 166 of the first electrode layer mesh are positioned in line with discs 156. If, as is typically the case, discs 156 are arranged in a two-dimensional repeating pattern that may be defined vectorially, the positions of junctions 166 may be defined using the same vector definitions, so that junctions 166 align vertically with discs 156.

As for array 30, each memory diode cell 153 in array 152 is defined by a respective electrode disc 156. Thus a given cell 153 includes sections of non-insulator layers 158 and 160 below a specific disc, and sections of mesh layer 162 including and surrounding the mesh junction 166 below the specific disc.

A diagram 180 illustrates a top view of an array 182 of memory diode cells 184. Apart from the differences described below, the operation of array 182 is generally similar to that of array 152, and elements indicated by the same reference numerals in both arrays 152 and 182 are generally similar in construction and in operation.

As for array 152, in array 182 discs 156 of second electrode layer 154 are typically arranged in a two-dimensional repeating pattern that may be defined vectorially. However, in array 182, positions of junctions 166 of mesh layer 162 may use the same vector definition to define the repetitions of the junctions, but with centers of apertures 164 aligned with discs 156.

In array 182, each memory diode cell 184 is defined by a respective electrode disc 156. Thus a given cell 184 includes sections of non-insulator layers 158 and 160 below a specific disc, and sections of mesh layer 162 framing the aperture 164 below the specific disc.

Figure 4:
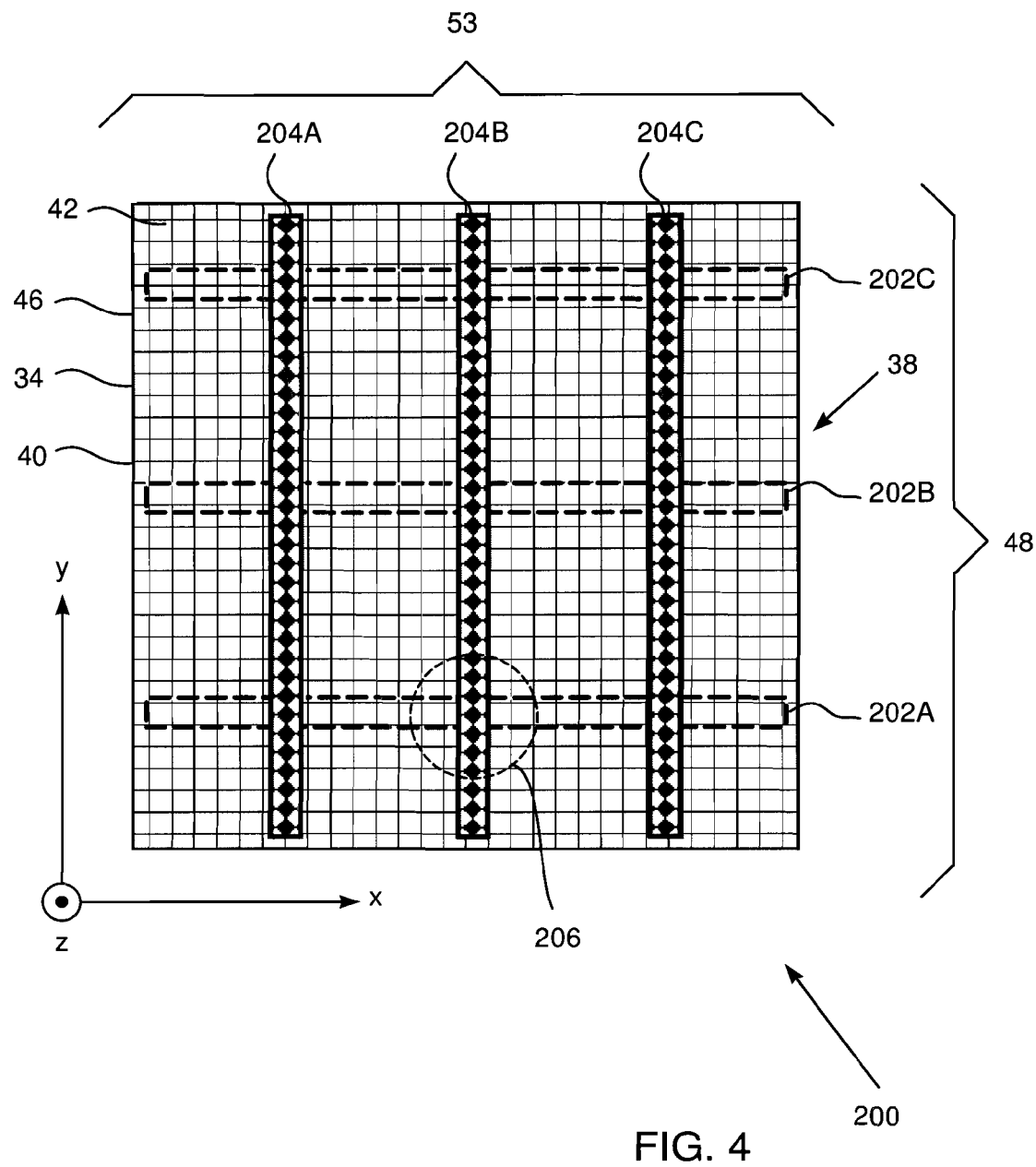
FIG. 4 is a schematic top view of a further alternative configuration of an array of memory diode cells, according to an embodiment of the present invention.

FIG. 4 is a schematic top view of a further alternative configuration of an array 200 of memory diode cells, according to an embodiment of the present invention. Apart from the differences described below, the operation of array 200 is generally similar to that of array 30 (FIG. 1), and elements indicated by the same reference numerals in both arrays 30 and 200 are generally similar in construction and in operation. Thus, array 200 comprises first non-insulator layer 34, second non-insulator layer 40, and junction layer 46 formed at the region of contact of the two non-insulator layers. In contrast to the configuration of first electrode layer 48 in array 30, in array 200 first electrode layer 48 comprises a first plurality of substantially similar parallel, separated, electrodes 202A, 202B, 202C, . . . , also referred to herein as electrodes 202. Electrodes 202 are connected to lower surface 38 of first non-insulator layer 34, and are typically, but not necessarily, separated from each other by equal distances. Herein, by way of example, electrodes 202 are assumed to be configured as linear conductors parallel to the x-axis.

Also in contrast to the configuration of second electrode layer 53 of array 30, in array 200 second electrode layer 53 comprises a second plurality of substantially similar, parallel, separated, electrodes 204A, 204B, 204C, also referred to herein as electrodes 204. Electrodes 204 are connected to upper surface 42 of second non-insulator layer 40, and as for electrodes 202 are typically, but not necessarily, separated from each other by equal distances. Herein, by way of example, electrodes 204 are assumed to be configured as linear conductors that are not parallel to electrodes 202, so that the two pluralities of electrodes, as viewed along to the z-axis, cross. By way of example, electrodes 204 are assumed to be parallel to the y-axis, so that the two pluralities of electrodes are orthogonal to each other.

The crossing of the two electrode layers defines different cells of array 200. For example, a cell 206 is defined by the crossing of electrode 202A and electrode 204B. Cell 206 comprises portions of electrode 202A, electrode 204B, non-insulator layer 34, non-insulator layer 40, and junction layer 46 in the region of the crossing point of the two electrodes. In array 200 there are other cells, all similar to cell 206, each of the cells being defined uniquely by one of electrodes 202 and one of electrodes 204. Eight such cells are illustrated in FIG. 4.

The arrays described above with reference to FIGS. 1-4 are examples of arrays of memory diode cells, wherein each cell has a single junction between two non-insulator layers. As is explained below, each cell of a single junction array is capable of assuming two stable states, so that each cell is able to store information in a binary format.

Embodiments of the present invention are not limited to cells with a single junction, so that embodiments of the present invention include arrays of memory cells having two or more junctions.

Figure 5A:
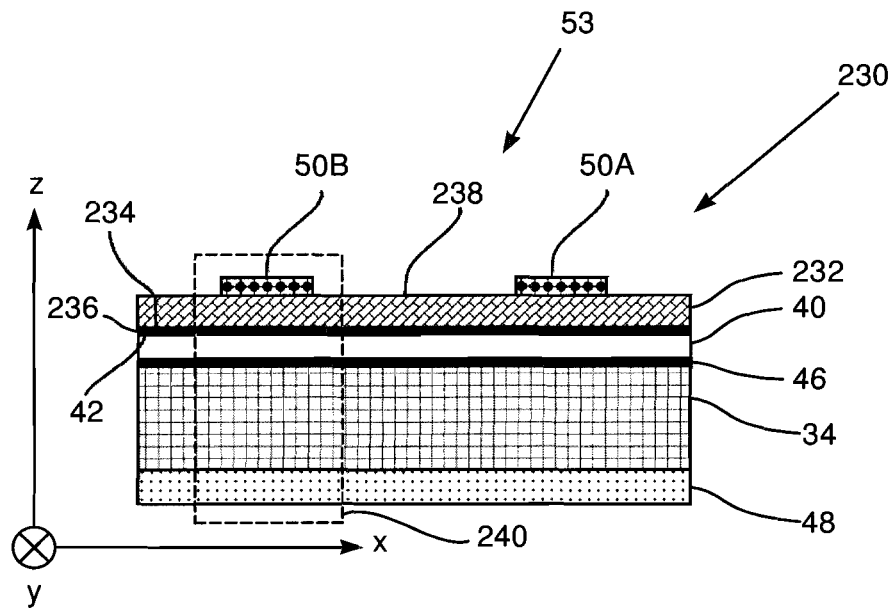
FIGS. 5A and 5B show schematic side views of arrays, according to embodiments of the present invention.
Figure 5B:
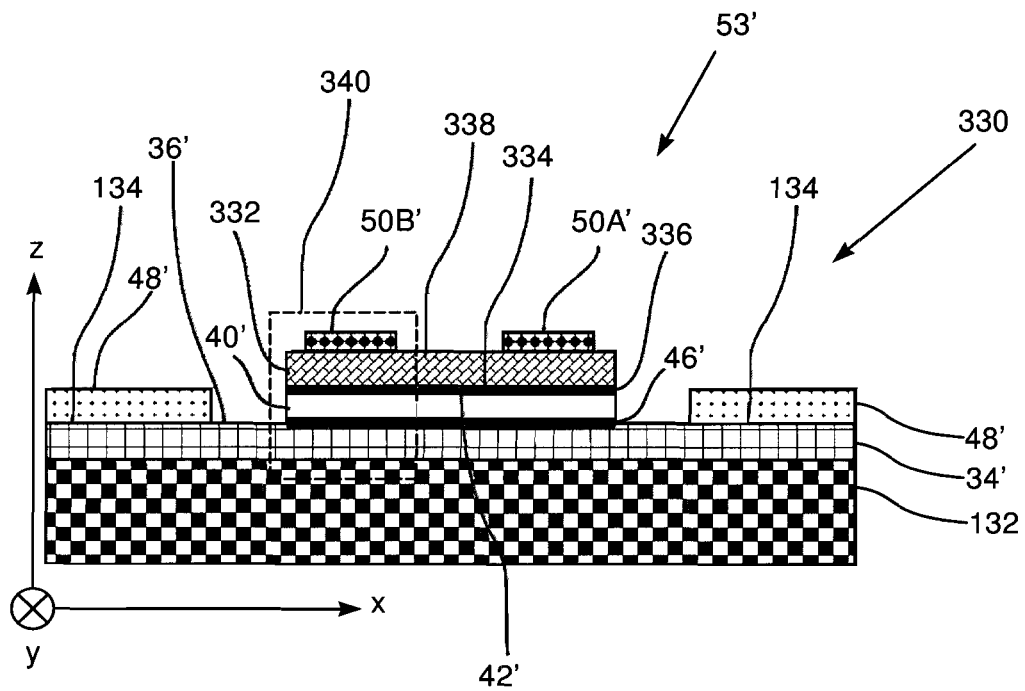

FIGS. 5A and 5B show schematic side views of arrays 230 and 330, each array having two junctions, according to embodiments of the present invention. Apart from the differences described below, the operation of arrays 230 and 330 are respectively generally similar to those of arrays 30 and 130 (FIGS. 1 and 2), and elements indicated by the same reference numerals in pairs of arrays 30 and 230, and in pairs of arrays 130 and 330, are generally similar in construction and in operation.

Array 230 (FIG. 5A) comprises first electrode layer 48, first non-insulator layer 34 which acts as a substrate, second non-insulator layer 40, and junction layer 46, herein also referred to as first junction layer 46, formed by the contact between layers 34 and 40. Between electrode layer 53, comprising disc electrodes 50, and second non-insulator layer 40 there is a third non-insulator layer 232. By way of example discs 50A, 50B of disc electrodes 50 are shown in FIG. 5A. A lower surface 234 of the third non-insulator layer contacts upper surface 42 of the second non-insulator layer, so forming a second junction layer 236 between the upper two non-insulator layers. Disc electrodes 50 are mounted on an upper surface 238 of third non-insulator layer 232.

As for array 30 all cells of array 230 are substantially similar in configuration and operation, and each cell of array 230 is defined by a particular disc electrode 50. Thus, a cell 240 defined by disc electrode 50B comprises the electrode, and sections of third non-insulator layer 232, second junction layer 236, second non-insulator layer 40, first junction layer 46, first non-insulator layer 34, and first electrode layer 48, the sections lying below the electrode.

Array 330 (FIG. 5B) is formed on insulating substrate 132, upon which is mounted first non-insulator layer 34'. As for array 130 first electrode layer 48' is mounted on upper surface 36' of layer 34' in region 134. However, in array 330 first electrode layer 48' comprises, by way of example, two separate conducting sheets mounted on two separate sub-regions comprising region 134. In addition to first electrode layer 48' and first non-insulator layer 34', array 330 comprises second non-insulator layer 40', and junction layer 46', herein also referred to as first junction layer 46', formed by the contact between layers 34' and 40'.

Between electrode layer 53', comprising disc electrodes 50', and second non-insulator layer 40' there is a third non-insulator layer 332. By way of example discs 50A', 50B' of disc electrodes 50' are shown in FIG. 5B. A lower surface 334 of the third non-insulator layer contacts upper surface 42' of the second non-insulator layer, so forming a second junction layer 336 between the upper two non-insulator layers. Disc electrodes 50' are mounted on an upper surface 338 of third non-insulator layer 332.

As for array 130 all cells of array 330 are substantially similar in configuration and operation, and each cell of array 330 is defined by a particular disc electrode 50'. Thus, a cell 340 defined by disc electrode 50B' comprises the electrode, and sections of third non-insulator layer 332, second junction layer 336, second non-insulator layer 40', first junction layer 46', and first non-insulator layer 34, the sections lying below the electrode. As for array 130, cells in array 330 use portions of region 134 to form a conducting path to electrode layer 48'.

Cells of a multiple junction array, such as those exemplified above with reference to FIGS. 5A and 5B are capable of assuming more than two stable states, so that each cell is able to store information in a "multi-nary" format. As is explained below, a cell in an array having j junctions, where n is a positive integer, can have up to $2^j$ different stable states, and such a cell is able to store information in a "$2^j$-nary" format. For example, a cell with 3 junctions may be configured to have eight different stable states, so being able to store information in an octal, i.e., base eight, format.

Non-Insulator Layers

Referring to FIGS. 1-5B, memory diode cells in arrays of such cells comprise a first and second electrode layer, and two or more non-insulator layers. In each array, at least one non-insulator layer has a sufficiently high ionic conductivity to enable migration of ions across the layer, i.e., in the z-direction, at an operating temperature of the cells of the array, the ionic migration typically occurring during polarization of the layer. The operating temperature of the cells is typically in the range of approximately 20° C.—approximately 30° C., although operating temperatures below and above this range are possible, depending on the mobility of the ions in the non-insulator layers.

A non-insulator layer may be thick ($\geq 1$ μm), such as in the case where the layer also acts as a substrate. Alternatively, the layer may be thin (<1 μm), and so does not typically act as a substrate. For an array wherein all layers are thin, the array may typically be formed on an insulator substrate.

A non-insulator layer with the sufficiently high ionic conductivity referred to above is herein termed an operational non-insulator layer, or just an operational layer. Thus, there is at least one operational layer in an array of memory diode cells. An operational layer also has some electronic conductivity, or is able to conduct electrons or holes injected to the layer, so that the layer is not completely insulating. In other words, an operational non-insulator layer may be an ionic conductor or solid electrolyte (SE) with a small electronic conductivity, or a mixed ionic electronic conductor (MIEC) with a relatively high ionic conductivity, comparable or even larger than the electronic conductivity. Typically, the operational layer has an ionic transference number equal to or greater than 0.5 and is less than 1. While the ionic transference number is less than one, it may be only slightly less than one. For example, the ionic transference number may be approximately 0.999,999, corresponding to a deviation from one of 1 part per million (ppm), or approximately 0.999,999,999, corresponding to a deviation of 1 part per billion (ppb), or it may be even closer to 1 than the 1 ppb deviation.

In the claims and in the description, the ionic transference number of a material is assumed to be the fraction of the total current carried by mobile ions of the material. For example, an ionic transference number of 0.5 means that 50% or ½ of the total current in a material is carried by mobile ions of the material.

Non-insulator layers which do not correspond to the operational definition given above, herein termed non-operational layers, typically comprise semiconductors. In some embodiments, a non-operational layer may comprise a metal. Non-operational layers have electronic conductivity with substantially no ionic conductivity, so that their ionic transference number is equal to, or approaches, 0.

Operational and non-metallic, i.e., semiconductor, non-operational layers may have their respective electronic conductivity configured to be p-type, where the material of the layer has a preponderance of holes, n-type, where the material has a preponderance of electrons, or the material may be intrinsic, i-type, where the electrons and holes have approximately equal concentrations.

Layer Formation

The layers of the arrays, i.e., the non-insulator layers and the two electrode layers, may be formed by any suitable method known in the art. Such methods include, but are not limited to, physical vapor deposition (PVD), chemical vapor deposition (CVD), sputtering, pulsed laser deposition (PLD), ion or e-beam deposition, thermal evaporation, molecular beam epitaxy (MBE), and metal-organic chemical vapor deposition (MOCVD). Alternatively, the layers may be deposited by wet or dry chemical routes including sol-gel processing methods, spin coating, dip-coating, and atomic layer deposition (ALD).

The different layers may be patterned according to a required device layout structure using conventional micro- or nanofabrication processes such as photolithography, e-beam lithography, wet or dry etching, imprint lithography, or any other suitable patterning system known in the art. As exemplified above, array layers may be deposited on an insulating substrate. Alternatively, one of the array layers may be configured as a substrate. Unlike other memory devices, which require application of an external electric field to one or more layers of the device after deposition of the layers so as to render the devices operable, layers of devices of the present invention do not require application of any external electric field, after layer deposition, for rendering the devices operable.

Junctions

Junctions of memory diode cells, such as junctions formed in junction layers 46, 46', 159, 236, and 336 are electrified junctions that are formed between two non-insulator layers, so that a space charge is formed in the region of the junction.

For non-metallic non-insulator layers, the layers may be configured to be p-type, n-type, or i-type, provided that the junction formed is one of a p-n, i-p, or i-n junction. In addition, at least one of the non-insulator layers is an operational layer. If one of the non-insulator layers is metallic, the other non-insulator layer is an operational layer, and may be p-type, n-type, or i-type.

In the case wherein the junction is formed of two operational layers, the space charge formed at the junction may reside on both sides of the junction in both layers. In the case wherein the junction is formed of one operational layer and one non-operational layer, more of the space charge typically resides in the more insulating layer, which is usually the operational layer.

Layers

Possible materials for operational non-insulator layers comprise (but are not limited to) materials with the compositions given in Listing I:

| LISTING I |
|---|
| Solid electrolytes (SE): |
| Oxide ion conductors: $ZrO_{2-\delta}$ and Y, Ca, or Sc-doped $ZrO_{2-\delta}$ $CeO_{2-\delta}$ and Gd, Sc, or Sm-doped $CeO_{2-\delta}$; $Bi_2O_{3-\delta}$ and Y or Er-doped $Bi_2O_{3-\delta}$; $LaGaO_{3-\delta}$ and $La_{1-x}Sr_xGa_{1-y}Mg_yO_{3-\delta}$ (LSGM); $Ba_2In_2O_{5-\delta}$ and $Ba_2In_{2-x}Zr_xO_{5-\delta}$; $Bi_4V_2O_{11-\delta}$ and $Bi_2V_{0.9}Cu_{0.1}O_{6-\delta}$ (BIMEVOX); $La_2Mo_2O_{9-\delta}$ and $La_2Mo_{2-x}W_xO_{9-\delta}$ (LAMOX); $Gd_2Ti_{2-x}Zr_xO_{7-\delta}$ and $Gd_{2-x}Ca_xTi_2O_{7-\delta}$. ($0 \leq x \leq 0.5, 0 \leq \delta \leq 0.5$) Proton conducting oxides: $SrCeO_{3-\delta}$ and Y or Yb-doped $SrCeO_{3-\delta}$; $BaZrO_{3-\delta}$ and Y-doped $BaZrO_{3-\delta}$; $BaCeO_{3-\delta}$ and Y or Nd-doped $BaCeO_{3-\delta}$. Proton conductors: $H_3(PMo_{12}O_{40}) \cdot nH_2O$ (n~29); $NH_4 \cdot \beta\text{-}Al_2O_3$; $NH_4 \cdot \beta\text{-}Ga_2O_3$; $a\text{-}Ta_2O_5 \cdot nH_2O$ Structurally disordered ceramics: $Na_3Zr_2PSi_2O_{12}$ (NASICON); β-alumina and sodium β-alumina (1.2 $Na_2O$-0.11 $Al_2O_3$); $LiAlSiO_4$. Fast ion conducting oxide glasses: $50Ag_2S$—$5GeS$—$45GeS_2$; $Li_2O$—$Al_2O_3$—$2SiO_2$; $Li_2O$—$Nb_2O_5$; $35Li_2O$—$30Li_2SO_4$—$10Li_2Cl_2$—$12.5SiO_2$—$12.5B_2O_3$; Li-doped vitreous $SiO_2$; $Li_2O$—$SiO_2$; $Li_2O$—$Bi_2O_3$; $Li_2O$—$Na_2O$—$B_2O_3$; $LaF_3$; $CaF_2$; $BaF_2$; $Ag_2S$; AgI; CuI; $PbCl_2$; β-$PbF_2$; $RbAg_4I_5$; AgCl; AgBr; CuBr; LiI; $Li_3N$; $Li_{1.3}Al_{0.3}Ti_{1.7}(PO_4)_3$; $Li_{3.5}V_{0.5}Ti_{0.5}O_4$; $LiI\text{-}Al_2O_3$; $Li_{2-2x}Cd_{1+x}Cl_4$; $Li_{3+x}P_{1-x}Si_xO_4$. |
| Mixed ionic electronic conductors (MIEC): |
| MIEC oxides: $Cu_{2-\delta}O$; PbO; $MoO_3$; $WO_3$; $(ZrO_2)_{1-x}(Y_2O_3)_{x-\delta}(CeO_2)_\delta$ (x~0.12, δ~0.01); $ZrO_{2-\delta}$ co-doped with Ti and Y or Ca or Sc; Ce-doped $ThO_2$; $La_{1-x}Sr_xCoO_{3-\delta}$ (x~0.4); $La_{1-x}Sr_xCo_{1-y}Fe_yO_{3-\delta}$ (x~0.4, y~0.2); $Ba_{1-x}Sr_xCo_{1-y}Fe_yO_{3-\delta}$ (x~0.4, y~0.2); Fe or Mn-doped $SrTiO_{3-\delta}$; $SrTi_{1-x}Fe_xO_{3-\delta}$ or $SrTi_{1-x}Mn_xO_{3-\delta}$ ($0 < x \leq 1$); $SrFeO_{3-x}$ ($0 \leq x \leq 1$); ($CaFeO_{3-x}$ $0 \leq x \leq 1$); Fe or Mn-doped $BaTiO_{3-\delta}$; $BaTi_{1-x}Fe_xO_{3-\delta}$ or $BaTi_{1-x}Mn_xO_{3-\delta}$ ($0 < x \leq 1$). Li-doped semiconductors: Li-doped Si; Li-doped Ge; Li-doped $Si_{1-x}Ge_x$ ($0 < x < 1$). $(AgBr)_{1-x}(AgCl)_x$; $Cu_{2-x}S$; $Cu_{2-x}Se$; $LiNbO_3$; $CuInSe_2$; $CuInS_2$; $Cd_{1-x}Hg_xTe$ (x~0.3). |

Possible materials for the non-operational non-insulator layers comprise (but are not limited to) materials with the compositions given in Listing II:

| LISTING II |
|---|
| Metals, semi-metals, or alloys of these materials, e.g.: Pt, Au, Ag, Cu, Ni, Se, As, Sn. |
| "Conventional" semiconductors: Si; Ge; $S_{1-x}Ge_x$; GaAs; InAs; $Ga_{1-x}In_xAs$ ($0 < x < 1$); InP; GaP; $Ga_{1-x}In_xP$ ($0 < x < 1$); GaN; InN; $Ga_{1-x}In_xN$ ($0 < x < 1$); CdS; C (diamond); SiC; and doped-derivatives of these materials. |
| Oxide semiconductors: ZnO; $TiO_2$; Nb-doped $TiO_2$; $SrTiO_3$; $SnO_2$; $In_2O_3$; $Ga_2O_3$; $Fe_2O_3$; $CuAlO_2$; $Ca_3Co_4O_9$; NiO; Li-doped NiO; and doped-derivatives of these materials. |

The electrodes, including their bonding layers, may comprise any suitable conducting material. Possible materials for the electrodes comprise (but are not limited to) materials with the compositions given in Listing III:

---
LISTING III
---
Any metallic element or a composition of different metals, or graphite. Conducting oxides such as $La_{1-x}Sr_xMnO_3$ (LSM), $La_{1-x}Sr_xCrO_3$ (LSC), $YBa_2Cu_3O_{7-x}$ (YBCO), $LaSrCuO_{3.5}$ (LASCO), $RuO_2$, $SrRuO_3$, La or Nb-doped $SrTiO_3$, Sn-doped $In_2O_3$ (ITO), F-doped $SnO_2$ (FTO), Al or Ga-doped ZnO (AZO or GZO).

---

Possible materials for an insulating substrate comprise (but are not limited to) materials with the compositions given in Listing IV ---
LISTING IV
---
Glass, silica, oxidized Si, alumina, sapphire, $SrTiO_3$, $LaAlO_3$.

---

EXAMPLES

Single cells having p-n junctions were prepared as follows. A first cell corresponded to a cell of single film array 30, a second cell corresponded to a cell of dual film array 130 (FIG. 1 and FIG. 2).

$SrTiO_3$ thin layers (~80 nm or ~160 nm thick), doped with Fe or Nb, were deposited on polished 1.4% Nb-doped (single film configuration, FIG. 1) and undoped (dual film configuration, FIG. 2) $SrTiO_3$ (100) single crystals, 1×1 cm$^2$ in area and 0.5 mm thick, purchased from Crystal Gmbh, of Berlin, Germany. The layers were deposited by pulsed laser deposition (PLD) using commercial 0.1% Fe or Nb-doped $SrTiO_3$ ceramic targets purchased from SCI Engineering Inc. of St. Charles, Mo. The layers were grown in oxygen at a pressure of 55 mTorr (single film configuration) or in high vacuum at ~10$^{-6}$ Torr (dual film configuration), and at a substrate temperature of 700° C.

6000 or 3000 pulses of a KrF excimer laser ($\lambda$=248 nm) with an energy flux of 1 J/cm$^2$ and a repetition rate of 3 Hz were shot at the targets for the single and dual film junction configurations, respectively. The deposition rate was approximately 0.27 Å per pulse, respectively, giving ~160 or ~80 nm thick layers in the single and dual film junction configurations.

Thus, first and second non-insulator layers 34, 40 (FIG. 1) of the single film array respectively comprised 1.4% Nb-doped $SrTiO_3$ (0.5 mm thick) acting as a substrate, and 0.1% Fe-doped $SrTiO_3$ epitaxial film (~160 nm thick). The Nb-doped $SrTiO_3$ was n-type, the Fe-doped $SrTiO_3$ was a mixed ionic electronic conductor at ambient temperatures, wherein the ionic conductivity was by negatively charged oxygen ions, and the electronic conductivity was predominantly by holes, i.e., was p-type.

First and second non-insulator layers 34', 40' (FIG. 2) of the dual film array respectively comprised 0.1% Nb-doped $SrTiO_3$ epitaxial film (~100 nm thick) and 0.1% Fe-doped $SrTiO_3$ epitaxial film (~100 nm thick). Substrate layer 132 comprised undoped $SrTiO_3$ single crystals (0.5 mm thick).

For each of the cells, electrode layers were formed by first sputtering a Ti bonding layer, (~20 nm thick) on the non-insulator surface to which the layer was to be attached, and then sputtering Pt contacts with a thickness of ~100 nm onto the Ti bonding layer.

Thus, for the single cell corresponding to the single film array, second electrode layer 53 comprised a given disc electrode 50 having a bonding layer 51 that was formed as a 1 mm diameter contact, and consisted of ~100 nm Pt on ~20 nm Ti. Second electrode layer 53 was formed on the upper surface of the 0.1% Fe-doped $SrTiO_3$ epitaxial film, corresponding to upper surface 42 of second non-insulator layer 40. First electrode layer 48 and bonding layer 49 comprised a large contact consisting of ~100 nm Pt on ~20 nm Ti. The first electrode layer, i.e., the large contact, was formed on the lower surface of the 1.4% Nb-doped $SrTiO_3$ (0.5 mm thick) substrate corresponding to lower surface 38 of first non-insulator layer 34.

For the single cell corresponding to the dual film array, second electrode layer 53' and first electrode layer 48' were both formed as 1 mm diameter contacts consisting of ~100 nm Pt on ~20 nm Ti, the titanium acting as bonding layers 51' and 49'. Second electrode layer 53' was formed on the upper surface of the 0.1% Fe-doped $SrTiO_3$ epitaxial film, corresponding to upper surface 42' of second non-insulator layer 40'. First electrode layer 48' was formed on the upper surface of the 0.1% Nb-doped $SrTiO_3$ epitaxial film, corresponding to region 134 of upper surface 36' of first non-insulator layer 34'.

FIG. 6 shows schematic X-ray diffraction diffractograms of the non-insulator layers of the single cells, according to an embodiment of the present invention. The diffractograms were prepared before the electrode layers were attached to the cells. The non-insulator layers grew epitaxially on the substrates, as demonstrated by high resolution X-ray diffraction (HRXRD) diffractograms 210 and 212. As shown by diffractogram 210, the only diffraction peaks observed are from reflections from crystallographic planes parallel to the substrate (100) planes, i.e. the (100), (200) reflections. Regions of other crystallographic orientations or additional crystal phases are not detected, confirming that the Fe-doped $SrTiO_3$ layer grew epitaxially on the (100) Nb-doped $SrTiO_3$ (100) substrate.

The high resolution scan in the vicinity of the (200) reflection, presented in diffractogram 212, was analyzed using extended kinematic approximation approach. The intense and narrow signal indicates high structural perfection of the grown layer with d-spacing homogeneity across the layer. The dispersion parameter of d-spacing fluctuations was obtained from the HRXRD, $\sigma$=0.005 Å. The intensity fringes observed in the high resolution scan indicate high structural quality and an atomically-smooth interface with the substrate. A film thickness of 164 nm was calculated from the intensity fringes.

Figure 7A:
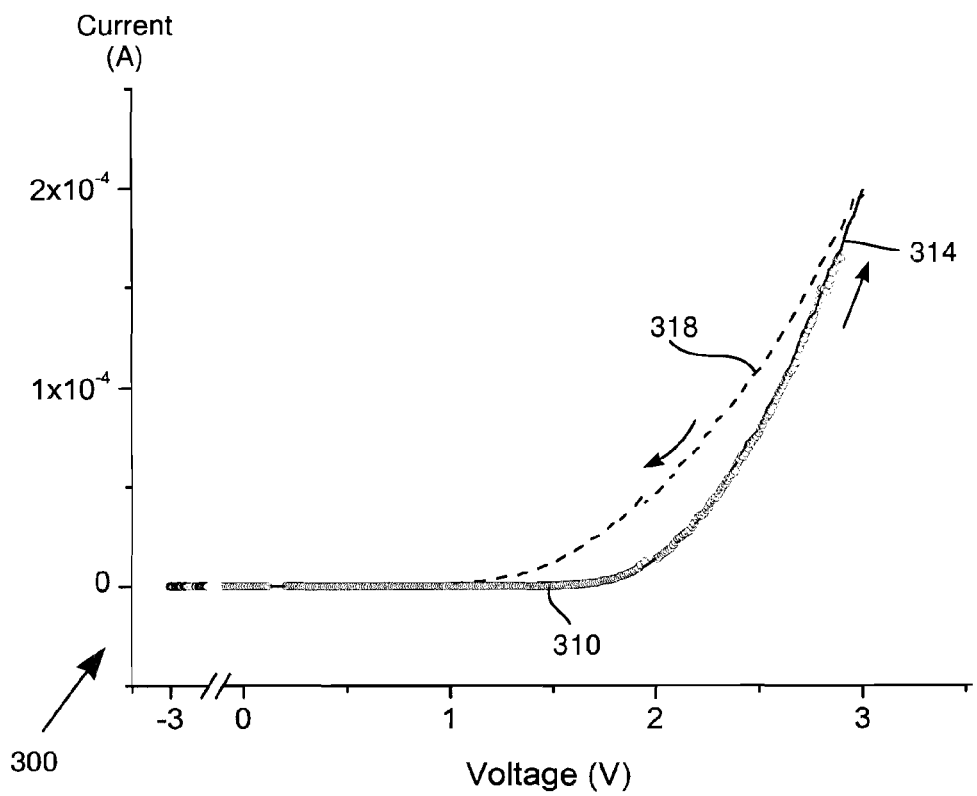
FIGS. 7A and 7B show schematic current vs. voltage graphs for a memory diode cell, according to an embodiment of the present invention.
Figure 7B:
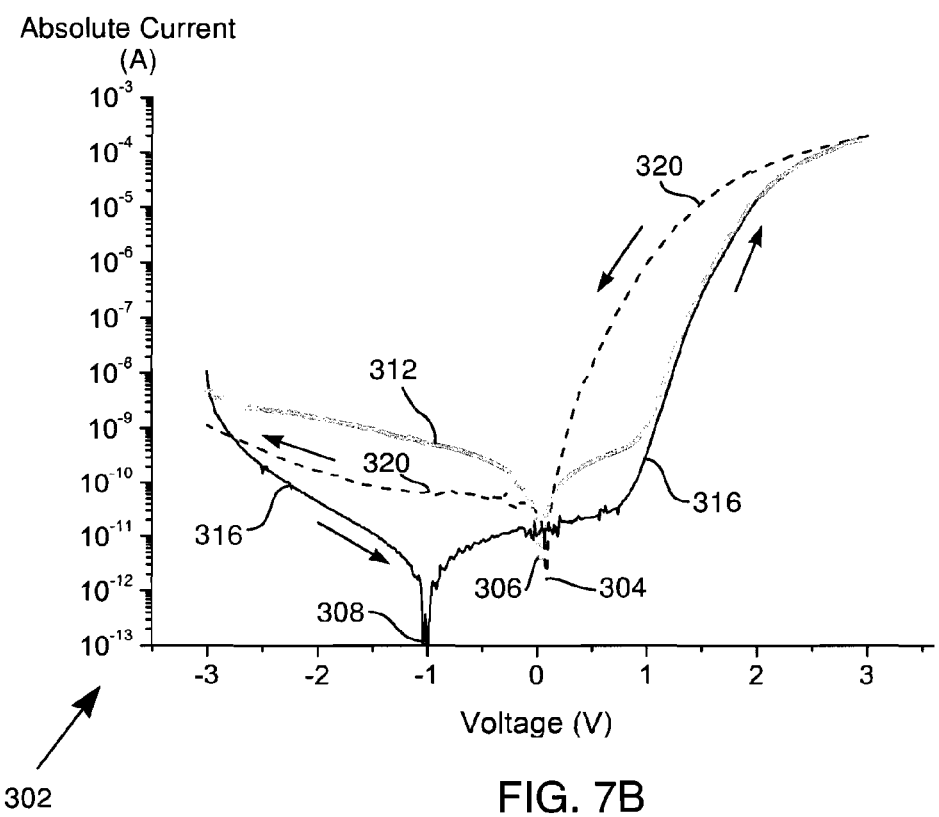

FIGS. 7A and 7B show schematic current vs. voltage graphs for a memory diode cell, according to an embodiment of the present invention. The graphs were generated by measuring the single cell of the single film configuration, described above. The inventor found similar results to those of the single film configuration for the dual film configuration.

The current-voltage (I-V) characteristics of the junction of the cell were measured using a Keithley 2635 source-meter. The voltage was applied in sweep or alternate modes. In the sweep mode the voltage may start from −3 volts and may increment in a stepwise fashion every 0.01 volt to +3 volts; once it reaches +3 volts it may start to sweep back to ~3 volts. In the alternate mode, the voltage alternates between +X and −X volts, the value of X starting at 3 and changing by 0.01 volt until it reaches zero. After each voltage change (in both the sweep and the alternate modes) the new voltage was held constant for 600 ms. All I-V measurements were carried out at ambient conditions.

A graph 300 illustrates the measurements on a linear scale. A graph 302 illustrates the measurements on a semi-logarithmic scale. In graph 302, current values to the left of minimum current cusps 304, 306, and 308 are negative, and current values to the right of the cusps are positive. For clarity, in the following explanation, the single film cell is assumed to be similar to a cell in array 30 (FIG. 1), and the explanation uses reference numerals from this array.

The voltage measurements assume that first electrode layer 48, i.e. the electrode layer connected to the n-type Nb-doped SrTiO₃ layer, is at a potential of 0 volts, and that the potential on second electrode layer 53, i.e., the electrode layer connected to the p-type Fe-doped SrTiO₃ layer, varies between +3 volts and −3 volts. When the second electrode layer has a positive voltage, the cell is forward biased; when the second electrode has a negative voltage, the cell is reverse biased.

Curves 310 and 312 illustrate measurements made on the cell in the alternate mode. The curves illustrate that in the alternate mode, the cell rectifies, with negative polarity (reverse bias) currents on the order of −1 to −10 nA between −0.5 and −3 volt, and positive polarity (forward bias) currents of up to +0.2 mA at +3 volt. The onset voltage for the current increase in forward bias is about +2 volt. In the alternate mode the current goes through a zero crossing point, i.e., I=0 when V=0 and vice versa, and there is no hysteresis displayed.

In contrast, the I-V measurements in the sweep mode display a prominent hysteresis between forward (from −3 to +3 volts) and reverse (from +3 to −3 volts) scans. The hysteresis is visible in the differences between forward scanned curves 314, 316, and reverse scanned curves 318, 320. The hysteresis is large; for example, at a voltage of approximately +0.8 V the ratio between the forward and reverse scan currents is approximately 5,000.

The hysteresis in the cell may be used for memory operations, as described hereinbelow. The inventor believes that the following explanation of the hysteresis applies.

If second electrode layer 53 is set negative, e.g., to −3 volts, junction layer 46, in this case a p-n junction, is negatively polarized. I.e., mobile ionic carriers such as oxygen vacancies in the p-type layer shift away from the p-n junction and towards the second electrode layer. As a result, a space charge and a built-in voltage ($V_{bi}$) across the junction increase. Consequently, a reverse saturation current ($I_S$) decreases because it depends exponentially on the built-in voltage, according to equation (1):

$$I_S \propto e^{-\frac{V_{bi}}{kT}} \quad (1)$$

where k is the Boltzmann constant, and
T is the absolute temperature.

The current (I) that flows through the junction also decreases since, according to the Shockley diode equation (2):

$$I = I_S \left[ e^{\frac{V_D}{nkT}} - 1 \right] \quad (2)$$

where $V_D$ is a voltage across the junction,
n is an ideality factor of the junction (typically between 1 and 2), and
k and T are as defined for equation (1).

In this situation, the junction is in a low current—high resistance state, corresponding to forward curves 314, 316.

In contrast, if second electrode layer 53 is set positive, e.g., to +3 volts, junction layer 46 is positively polarized. I.e., mobile ionic carriers shift towards the p-n junction. As a result, the space charge and built-in voltage across the junction decrease, the reverse saturation current increases, and the current flowing through the junction (at a given voltage) increases. In this situation the junction is in a high current—low resistance state, corresponding to reverse curves 318, 320.

The two states of the junction are stable, and may be used to store binary information.

Figure 8A:
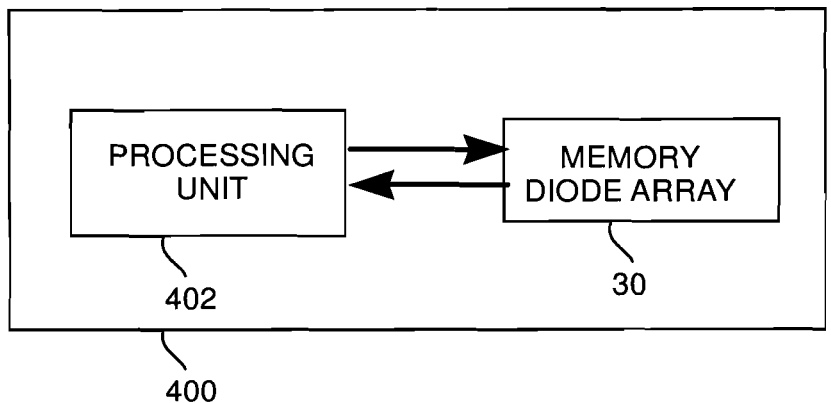
FIG. 8A is a schematic diagram illustrating a computing system using an array of memory diode cells, according to an embodiment of the present invention.
Figure 8B:
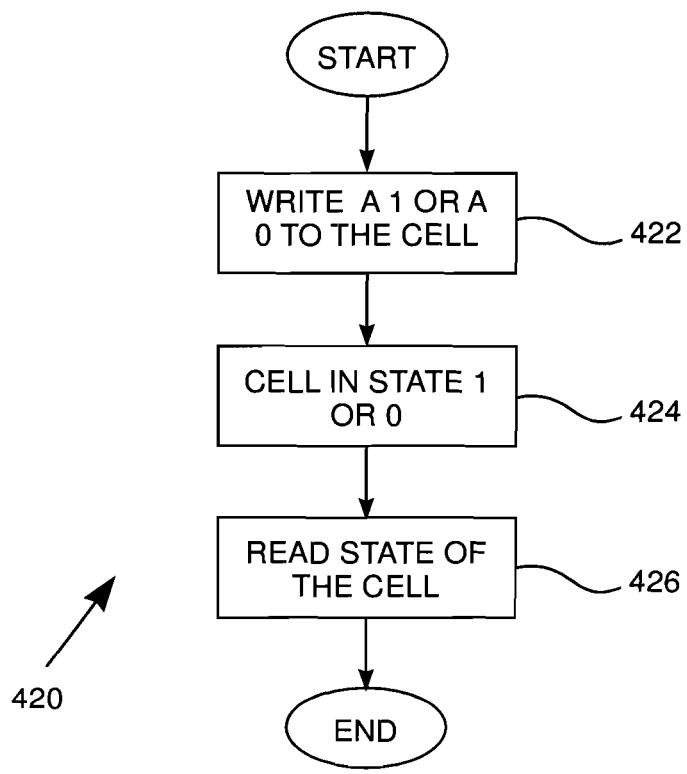
FIG. 8B is a flowchart of steps used by the computing system in addressing a cell in the array, according to an embodiment of the present invention.

FIG. 8A is a schematic diagram illustrating a computing system 400 using an array of memory diode cells, and FIG. 8B is a flowchart 420 of steps used by computing system 400 in addressing a cell in the array, according to embodiments of the present invention.

Computing system 400 comprises a processing unit (PU) 402, which may be any processing unit known in the art. PU 402 is assumed to be coupled to an array of memory diode cells configured as described herein. By way of example the array in system 400 is assumed to comprise array 30 (FIG. 1).

For simplicity, the steps in flowchart 420 refer to a given cell 32 in array 30 constructed according to the single film configuration example described above, and first electrode layer 48 is assumed to be at a potential of 0 volts. Those of ordinary skill in the art will be able to adapt the explanation herein, *mutatis mutandis*, for cells of other embodiments of the present invention, and wherein the potential of first electrode layer 48 differs from zero.

By way of example, the low current—high resistance state described above is assumed to represent a "1" or "set" state, and the high current—low resistance state is assumed to represent a "0" or "reset" state.

In a write step 422 PU 402 writes a 1 to the cell by polarizing junction 46 negatively, for example by applying −3 volts to second electrode layer 53. Alternatively, PU 402 writes a 0 to the cell by polarizing junction 46 positively, for example by applying +3 volts to second electrode layer 53. The voltages applied to second electrode layer 53, −3 or +3 volts, are termed the write voltages of the cell.

In a state step 424, the cell is in one of its two possible states, according to the polarization applied in write step 422. If the cell is in its 1 state, reverse curves 318, 320 apply. If the cell is in its 0 state, forward curves 314, 316 apply.

In a read step 426, PU 402 applies a voltage, smaller in magnitude than the write voltages, to first electrode layer 48. The voltage applied is herein termed the read voltage, and is used to determine if the forward or reverse curves apply to the cell. On application of the read voltage, PU 402 measures the current generated by the cell, and the measured current provides an indication to the processing unit as to which of the two possible curves apply to the cell, so determining the state of the cell. Thus, PU 402 ascertains the state, 0 or 1, stored in the cell. In some embodiments, after reading the stored state, write step 422 may be repeated to re-write the cell to its state in step 424.

As a first example, assume the read voltage is approximately +0.8 V, and that the write voltages are as given above. Referring to graph 302, if the current measured is approximately $10^{-11}$ A, then forward curve 316 applies, and the cell is in its low current—high resistance, or 1, state. If the current measured is approximately $10^{-8}$ A, then reverse curve 320 applies, and the cell is in its high current—low resistance, or 1 state.

As a second example, the read voltage may be approximately −1.5 V, with the write voltages given above. In this case the current measured may be approximately $10^{-11}$ A, wherein forward curve 316 applies, and the cell is in its 1 state, or the current measured may be $10^{-10}$ A, wherein reverse curve 320 applies, and the cell is in its 0 state.

Typically, for a given memory diode cell there is an optimal read voltage, which gives a maximum ratio between the currents measured in the two states of the cell. The optimal read voltage is a function of the hysteresis of the cell. For the single film example described above, the optimal read voltage was approximately +0.8 V.

Figure 9A:
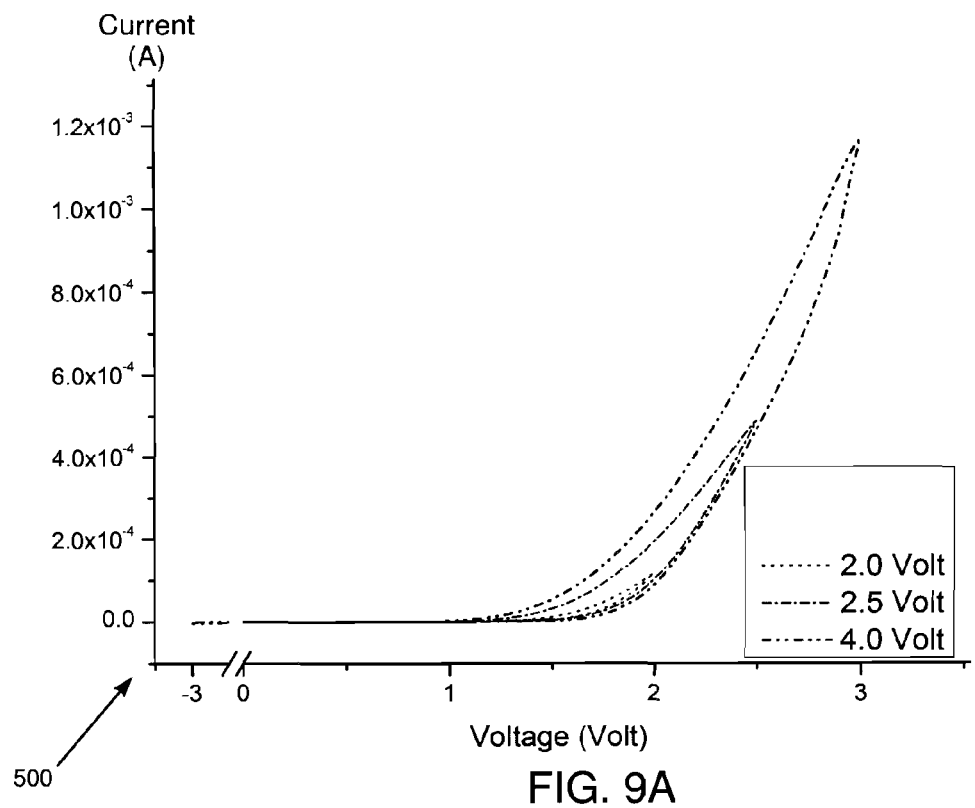
FIGS. 9A and 9B show further schematic current vs. voltage (I-V) graphs for a memory diode cell, according to an embodiment of the present invention.
Figure 9B:
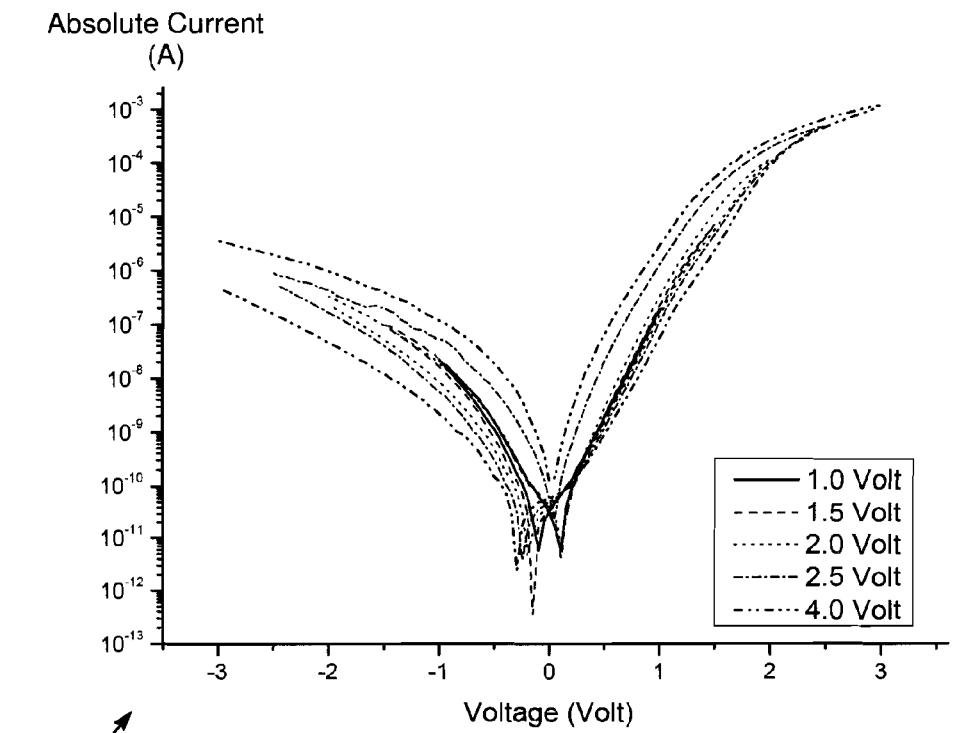

FIGS. 9A and 9B show further schematic current vs. voltage (I-V) graphs for a memory diode cell, according to an embodiment of the present invention. The graphs were generated by measuring the single cell of the single film configuration example described above. The methods of measurement used the sweep mode, explained above with reference to FIGS. 7A and 7B. As explained herein, the inventor has found that the hysteresis of a given cell may be altered by applying differing preset voltages to the cell, and thus to the cell's junction, prior to measuring the hysteresis.

A graph 500 illustrates the I-V measurements on a linear scale. A graph 502 illustrates the measurements on a semi-logarithmic scale. In graph 502, current values to the left of minimum current cusps are negative, and current values to the right of the cusps are positive.

For each set of measurements, a different negative preset voltage was applied to the cell for a preset time period of 20 s, prior to measuring the hysteresis of the cell. The different voltages were −1.0V, −1.5V, −2.0V, −2.5V, and −4.0V. The three curves of graph 500, for the voltage values of −2.0V, −2.5V, and −4.0V, and the five curves of graph 502, for the five different voltages applied, show that the hysteresis of the cell increased with increasing negative preset voltage applied to the cell.

Figure 10:
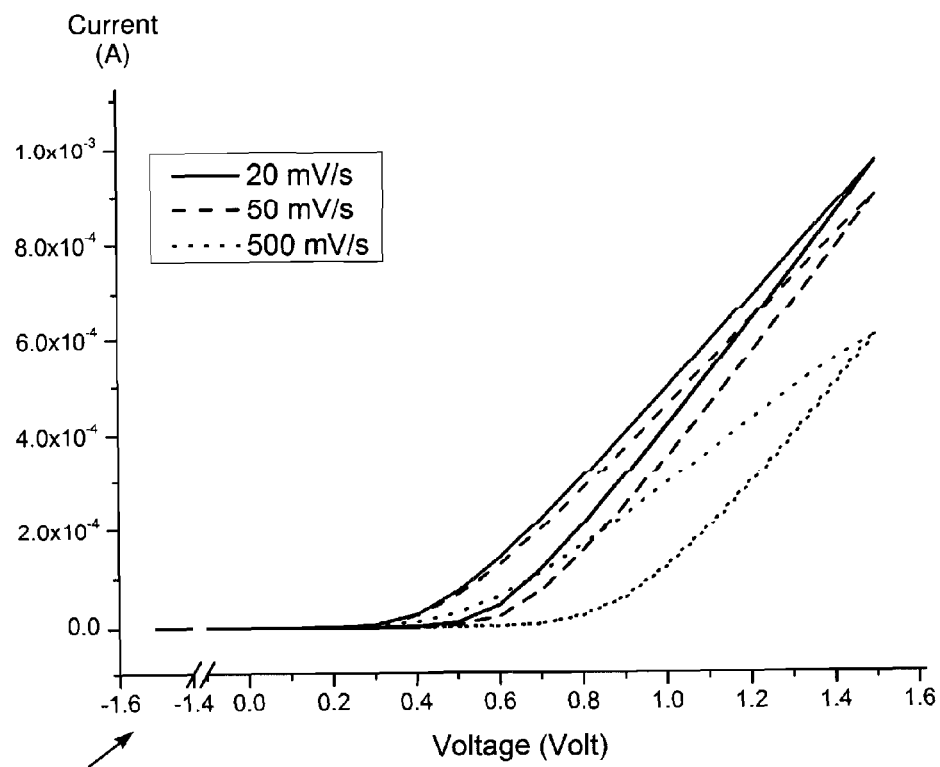
FIG. 10 shows a yet further schematic current vs. voltage graph for a memory diode cell, according to an embodiment of the present invention.

FIG. 10 shows a yet further schematic current vs. voltage (I-V) graph 550 for a memory diode cell, according to an embodiment of the present invention. The curves of graph 550 were generated by measuring the single cell of the single film configuration example described above. The methods of measurement used a sweep mode, explained above with reference to FIGS. 7A and 7B, with the difference that instead of sweeping the voltages applied to the cell in a stepwise fashion, the swept voltages were changed at differing constant rates. The inventor has found that the hysteresis of a given cell changes according to the rate at which the cell is swept.

As illustrated in the three I-V curves of graph 550, for sweep rates of 20 mV/s, 50 mV/s, and 500 mV/s, as the sweep rate increases, the hysteresis of the cell increases.

The effects on the hysteresis of a memory diode cell, described above with respect to FIGS. 7, 9A, 9B, and 10, enable memory diode cells, implemented according to embodiments of the present invention, to be tuned to have different characteristics. For example, the hysteresis of a given cell may be configured, by having differing preset voltages and/or differing sweep rates, so as to change the optimal read voltage (referred to in the description of flowchart 400) for the cell.

Referring back to graph 302 and graph 502 (FIGS. 7B and 9B), the curves of the graphs illustrate another characteristic of memory diode cells, apart from their hysteresis, that has been found by the inventor: there is a shift in an open circuit voltage (OCV) value, $V_{OC}$, between the forward and reverse scans. $V_{OC}$ is the voltage that occurs for each scan at the minimum current point of the curves, i.e., at the cusps of each curve. For example, as illustrated in graph 302, the forward scan gives an OCV value at cusp 308 of approximately −1 V, and the reverse scan gives an OCV value at cusp 304 of approximately 0 V. Graph 502 illustrates the same effect for all preset voltages applied prior to measuring the hysteresis. For example, the curve for a preset voltage of −1.0 V has OCVs, at the cusps of the curves, of approximately 0 V and −0.1 V; the curve for a preset voltage of −4.0 V has OCVs of approximately 0 V and approximately −0.3 V.

The shift in OCV, and the fact that at least one of the OCVs for a given curve is non-zero, is in complete contrast to other memory devices known in the art, such as those known as memristors. Other memory devices have a zero crossing point, i.e., I=0 when V=0, and vice versa, for both forward and reverse scans of the devices.

The fact that memory diode cells configured as described herein have non-zero OCVs indicates that such memory diode cells are able to store energy, unlike memory devices known in the art. An explanation for this behavior is provided below.

Figure 11:
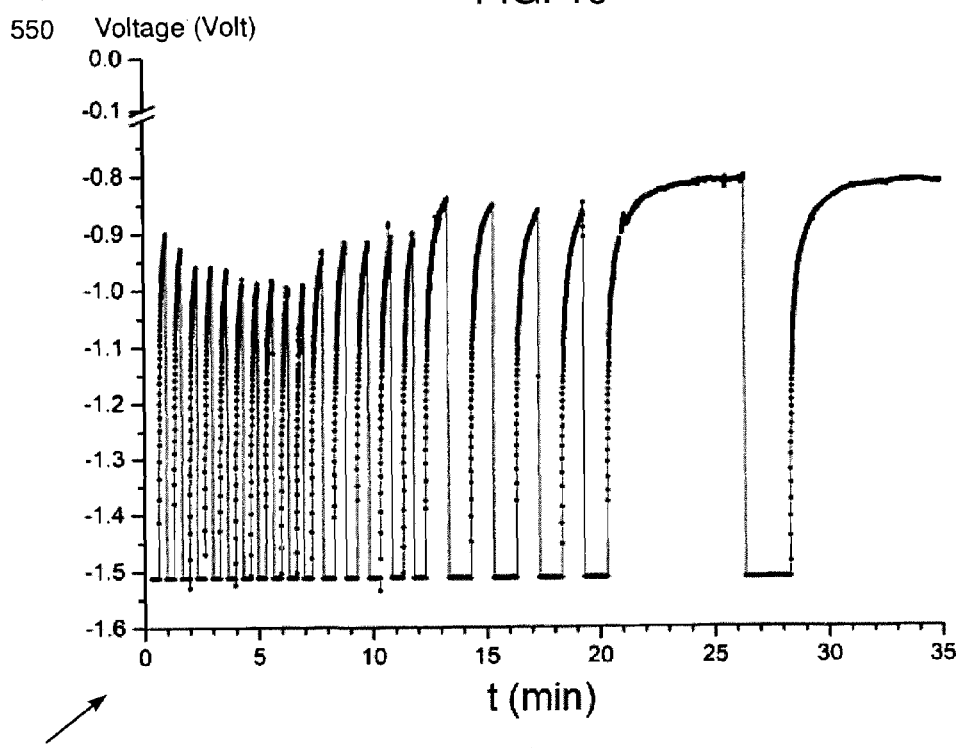
FIG. 11 is a graph of voltage vs. time for a memory diode cell, according to an embodiment of the present invention.

FIG. 11 is a graph 600 of voltage vs. time for a memory diode cell, according to an embodiment of the present invention. Graph 600 was produced using measurements on the single film configuration cell example described above. As is described above with reference to FIGS. 7A and 7B, the voltage measurements assume that the first electrode layer (layer 48 in FIG. 1) connected to the n-type Nb-doped $SrTiO_3$ layer is at a potential of 0 volts, and the voltage is measured at the second electrode layer (layer 53) connected to the p-type Fe-doped $SrTiO_3$ layer.

A battery switchably applied a voltage of −1.5 V to the second electrode layer of the cell (reverse bias configuration). With the switch closed, the battery and cell were in parallel, and the battery "charged" the cell. With the switch closed, an electrometer read the potential across the battery. With the switch open, when the cell "discharged," the battery was not accessible to the electrometer, and the electrometer read the potential across the cell. With the switch open, the cell was in an OCV configuration. The switching was cycled on and off, so that the electrometer measured the charging and OCV potentials cyclically. Referring to graph 302 (FIG. 7B) the cycling corresponds to following the left side of curve 316 from its cusp to −1.5 V, and then from −1.5 V to its cusp.

Graph 600 demonstrates that repeatedly recycling the memory diode cell continuously returns a repeatable, stable OCV of approximately −0.8 V that is constant over a substantial period of time, many minutes. Similarly, cyclically applying an opposite voltage of +1.5 V to the cell also produces a repeatable, stable OCV that is substantially different from the −0.8 V found above, and is typically approximately 0 V.

The description above with regard to the different values of OCV for a memory diode cell can be applied to a different method for reading the state of the cell, as is exemplified by the description of flowchart 700 below.

Figure 12:
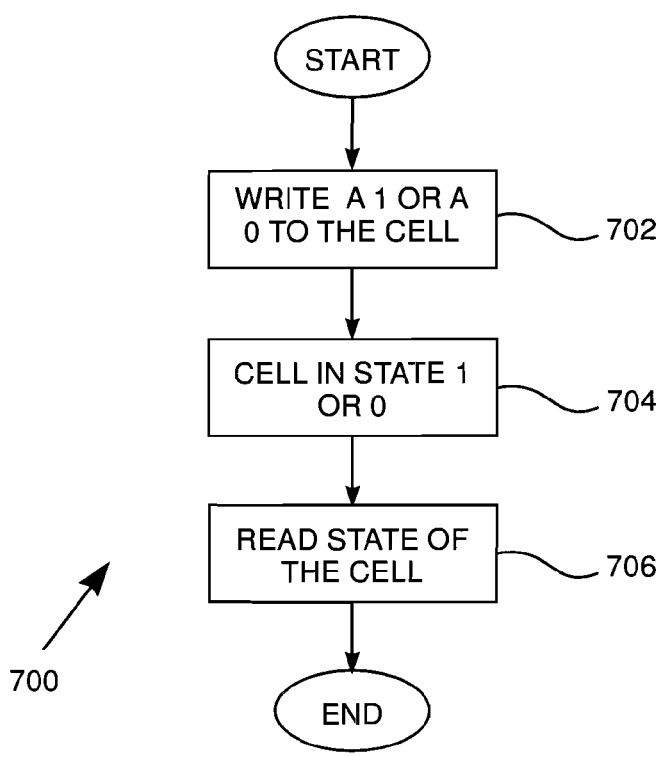
FIG. 12 is a flowchart of steps used by the computing system of FIG. 8A in addressing a cell in a memory diode cell array, according to an alternative embodiment of the present invention.

FIG. 12 is a flowchart 700 of steps used by computing system 400 (FIG. 8A) in addressing a cell in a memory diode cell array, according to an alternative embodiment of the present invention. Except as described below, flowchart 700 assumes substantially the same conditions as flowchart 420 (FIG. 8B) so that steps 702 and 704 are respectively substantially the same as steps 422 and 424.

In a read step 706, which replaces read step 426 of flowchart 400, PU 402 measures the OCV of the cell, the value of the OCV indicating the state of the cell. For example, referring to graph 302 (FIG. 7B), if the OCV is approximately −1 V, the cell is in its low current—high resistance, or 1 state; if the OCV is approximately 0 V, the cell is in its high current—low resistance, or 0 state. As for read step 426, in some embodiments write step 702 may be repeated to re-write the cell to its state in step 704.

It will be understood that the reading of the OCV by PU 402 involves negligible current flow through the cell and the reading therefore consumes negligible power and has negligible influence on the information stored in the cell.

Figure 13:
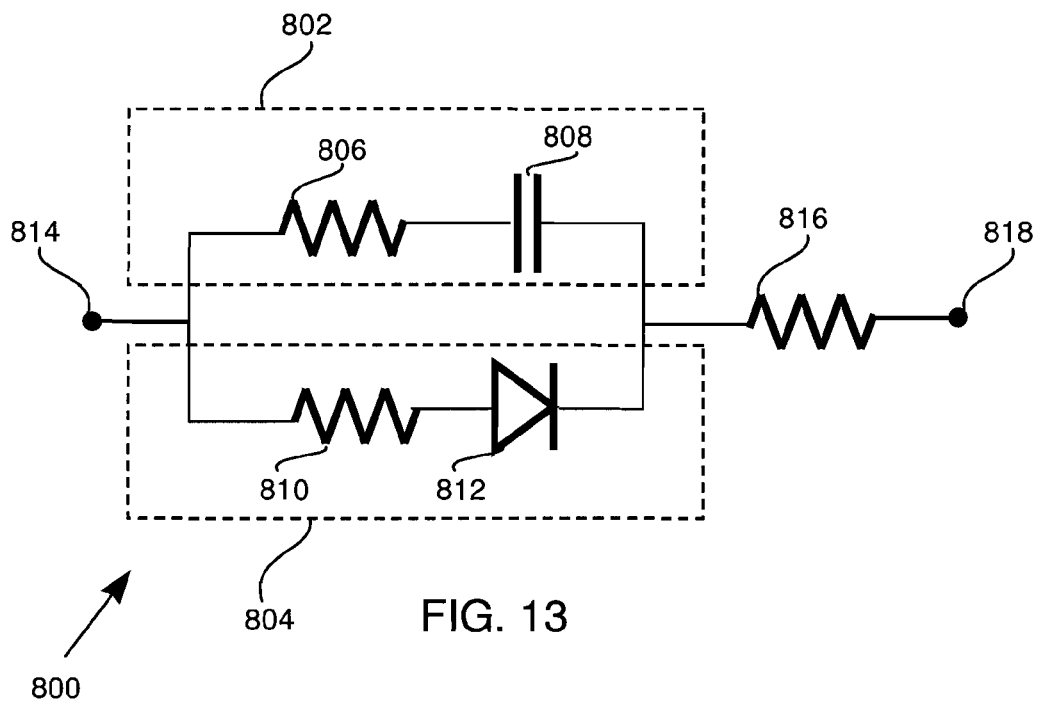
FIG. 13 is a schematic equivalent circuit diagram of a memory diode cell, according to an embodiment of the present invention.

FIG. 13 is a schematic equivalent circuit diagram of a memory diode cell, according to an embodiment of the present invention. The inventor believes that the following description explains observed properties of a memory diode cell, and the equivalent circuit is based on this explanation.

The energy storage capacity of a cell is connected with its chemical capacitance, which arises from field-induced stoichiometry modifications in one or more of layers that form the junction of the cell. When a voltage is applied to the cell, mobile ionic defects such as oxygen vacancies redistribute according to the field direction and as a result the cell becomes polarized. In the single film example described above the energy storage is assumed to come from the chemical capacitance of the p-type Fe-doped $SrTiO_3$ layer, and the property of chemical capacitance applies to all operational layers, as defined herein. Thus, cells having junctions with at least one operational layer are able to store energy by becoming polarized, so changing the chemical capacitance of the layer. The chemical capacitance change may be accomplished by applying a voltage to, or passing a current through, the layer.

In an equivalent circuit 800, a memory diode cell is assumed to comprise an ionic rail 802 and a parallel electronic rail 804. The ionic rail comprises a resistor 806 in series with a chemical capacitor 808. The electronic rail comprises a resistor 810 in series with a diode 812. One side of the parallel combination of rails is connected to a first terminal 814 of the cell, and a second side of the parallel combination is connected, via a series resistor 816 to a second terminal 818 of the cell. The first and second terminals correspond to the first and second electrodes of the cell.

The OCV shifts described above result from the polarization effect occurring in the cell. When an external power source applies a negative voltage to the cell, i.e., if terminal 814 is set negative, assuming terminal 818 is zero, diode 812 behaves as an open circuit allowing only a very small current (the reverse current) to pass through the electronic rail. As a result, some current goes into the ionic rail and charges capacitor 808, i.e., ionic current is stored as charge in capacitor 808. If the cell is disconnected from the external power source immediately after charging the chemical capacitor, the capacitor remains charged—giving rise to a negative OCV as observed in the forward I-V scans presented in graphs 302 and 502 (FIGS. 7 and 9B). When positive voltage is applied to the cell the diode behaves as a closed circuit and (electronic) current passes through the electronic rail, the ionic rail becoming inactive. This explains the zero OCV in the reverse I-V scans in graphs 302 and 502.

Consideration of the description above shows that a memory diode cell having a single junction can be in one of two different stable states. The states are defined by a hysteresis characteristic of the cell, and which of the two states the cell is in may be determined by measuring where on a hysteresis curve the cell is, for example by measuring the current generated for a given read voltage, or by measuring an open circuit voltage of the cell.

In general, a memory diode cell having j junctions, where j is an integer greater than or equal to 1, can be in one of $2^j$ stable states, each of the states being defined by respective hysteresis characteristics generated by the j junctions. As explained above, the hysteresis may be configured to be different, so that each of the $2^j$ stable states may be configured to be different. The different $2^j$ stable states may be determined by measuring which of the $2^j$ different currents is generated by a given read voltage, or by measuring which of the $2^j$ different open circuit voltages is generated.

Memory diode cells of the present invention comprise junctions, such as p-n junctions, as is explained above. Cells based on such junctions have considerably smaller cross-talk to adjacent cells in an array of such cells than cells based on other junctions, such those of metal-insulator-metal devices.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

I claim:

1. A memory cell, comprising:
a first non-insulator;
a second non-insulator, different from the first non-insulator, forming a rectifying junction with the first non-insulator;
a first electrode connected to the first non-insulator; and
a second electrode connected to the second non-insulator, directly or through one or more additional non-insulators;
wherein at least one of the first and second non-insulators comprises an operational non-insulator having an ionic transference number less than 1 and greater than or equal to 0.5,
wherein the first non-insulator and the second non-insulator are selected so that the junction has electrical rectifying characteristics of a diode junction, and
wherein the diode junction occurs at the interface between the first and second non-insulators.

2. The cell according to claim 1, wherein the first non-insulator comprises a p-type material having a preponderance of holes, and the second non-insulator comprises an n-type material having a preponderance of electrons, such that the junction between the first and second non-insulators comprises a p-n junction.

3. The cell according to claim 1, wherein the cell is configurable into one of two different stable electrical states, accessible by an electrical measurement applied to the cell.

4. The cell according to claim 3, wherein the cell is configured into one of the two different states in response to applying one of a forward and a reverse voltage or current to the cell.

5. The cell according to claim 3, wherein the cell has a hysteresis in its current-voltage characteristics, so that at a specific voltage the cell has a high-resistance after a first voltage is applied to the cell and a low-resistance after a second voltage is applied to the cell.

6. The cell according to claim 5, wherein the hysteresis is configured by applying one of a preset voltage and a voltage changing at a preset rate to the cell.

7. The cell according to claim 5, wherein the one of the two different stable states can be ascertained by measuring a current generated on application of a read voltage between the first and second electrodes.

8. The cell according to claim 3, wherein the two different stable states have differing open circuit voltages between the first and the second electrodes.

9. The cell according to claim 8, wherein the one of the two different stable states has a zero open circuit voltage, whereas the other state has a non-zero open circuit voltage.

10. The memory cell according to claim 1, wherein the one or more additional non-insulators comprise n third non-insulators, where n is an integer greater than or equal to 1, connected sequentially between the second non-insulator and the second electrode to form with the first and second non-insulators (n+1) junctions,
  wherein at least one of the first, second and n third non-insulators is chosen from a group consisting of a solid electrolyte and a mixed ionic electronic conductor and has an ionic transference number less than 1 and greater than or equal to 0.5.

11. The memory cell according to claim 10, wherein the (n+1) junctions form (n+1) diodes.

12. The memory cell according to claim 10, wherein the cell has a hysteresis, and wherein the $2^{(n+1)}$ stable states are defined by respective hysteresis states of the cell.

13. The memory cell according to claim 10, wherein the $2^{(n+1)}$ stable states have respective $2^{(n+1)}$ open circuit voltages.

14. The memory cell according to claim 13, wherein a first open circuit voltage of the $2^{(n+1)}$ open circuit voltages is zero, and wherein a second open circuit voltage is different from zero.

15. A memory array, comprising:
  a first non-insulator layer;
  a second non-insulator layer, different from the first non-insulator layer, forming a junction layer with the first non-insulator layer;
  a first electrode layer connected to the first non-insulator layer;
  a second electrode layer connected to the second non-insulator, directly or through one or more additional non-insulators, and configured to define a plurality of memory cells within the array, between respective electrodes in the first and second electrode layers,
  wherein at least one of the first and second non-insulator layers is chosen from a group consisting of a solid electrolyte and a mixed ionic electronic conductor and has an ionic transference number less than 1 and greater than or equal to 0.5,
  wherein the first non-insulator and the second non-insulator are selected so that the junction has electrical rectifying characteristics of a diode junction, and
  wherein the diode junction occurs at the interface between the first and second non-insulators; and
  a processing unit configured to measure an open circuit voltage of at least one of the memory cells and accordingly indicate a value stored by the at least one of the cells.

16. The memory array according to claim 15, wherein the first non-insulator comprises a mixed ionic electronic conductor and the second non-insulator comprises a non-operational non-insulator.

17. The memory array according to claim 15, wherein the first and second non-insulator layers comprise epitaxial layers.

18. The memory array according to claim 15, wherein the first and second non-insulator layers are selected so that the junction layer acts for each cell as a diode, having electrical rectifying characteristics.

19. The memory array according to claim 15, wherein the first non-insulator comprises a p-type material and the second non-insulator comprises an n-type material.

20. The cell according to claim 1, wherein the first and second non-insulators comprise non-insulators formed as epitaxial layers.

21. The cell according to claim 1, wherein the cell is configurable into one of at least three different stable electrical states.

22. The cell according to claim 8, wherein the two different stable states have different open circuit voltages of different polarities.

23. A method of storing data, comprising:
  providing a memory cell including:
    a first non-insulator;
    a second non-insulator, different from the first non-insulator, forming a junction with the first non-insulator;
    a first electrode connected to the first non-insulator;
    a second electrode connected to the second non-insulator, directly or through one or more additional non-insulators, wherein the first non-insulator and the second non-insulator are selected so that the junction has electrical rectifying characteristics of a diode junction,
    wherein the diode junction occurs at the interface between the first and second non-insulators;
  applying to the memory cell a forward or reverse voltage depending on a value to be stored in the cell; and
  measuring an open circuit voltage of the cell and accordingly indicating a value stored in the cell.

24. The method of claim 23, wherein the first and second non-insulators comprise epitaxial non-insulators.

25. The method of claim 23, wherein the first non-insulator comprises a p-type material and the second non-insulator comprises an n-type material.

26. The cell according to claim 1, wherein the first non-insulator comprises an operational non-insulator and the second non-insulator comprises a non-operational non-insulator.

* * * * *